(12) United States Patent
Yamazaki et al.

(10) Patent No.: US 9,806,140 B2
(45) Date of Patent: *Oct. 31, 2017

(54) DISPLAY DEVICE

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 876 days.

This patent is subject to a terminal disclaimer.

(21) Appl. No.: 12/535,734

(22) Filed: Aug. 5, 2009

(65) Prior Publication Data

US 2010/0073272 A1 Mar. 25, 2010

Related U.S. Application Data

(60) Division of application No. 11/041,454, filed on Jan. 25, 2005, now Pat. No. 7,573,469, which is a
(Continued)

(30) Foreign Application Priority Data

Aug. 8, 2001 (JP) .................................. 2001-241463

(51) Int. Cl.
G09G 3/36 (2006.01)
H01L 27/32 (2006.01)
G02F 1/1345 (2006.01)

(52) U.S. Cl.
CPC ...... *H01L 27/3276* (2013.01); *G02F 1/13454* (2013.01); *G02F 2001/13456* (2013.01); *H01L 2251/5315* (2013.01)

(58) Field of Classification Search
CPC ....... G02F 1/13454; G02F 2001/13456; H01L 2251/5315; H01L 27/3276
(Continued)

(56) References Cited

U.S. PATENT DOCUMENTS 5,148,301 A    9/1992  Sawatsubashi
5,691,793 A *  11/1997 Watanabe et al. ............ 349/155
(Continued)

FOREIGN PATENT DOCUMENTS

EP    1 077 389 A1    2/2001
EP    1 087 366 A2    3/2001
(Continued)

OTHER PUBLICATIONS

Office Action (Korean Patent Application No. 2002-0046259) mailed Feb. 23, 2009 (English translation).

*Primary Examiner* — Afroza Chowdhury
(74) *Attorney, Agent, or Firm* — Fish & Richardson P.C.

(57) ABSTRACT

In a display device having driving circuits formed on the same substrate where pixels are formed, the lateral frame area of the display device is reduced. A gate signal line driving circuit is placed in parallel with a source signal line driving circuit, so that no driving circuits are provided in at least two opposing directions out of four directions with respect to a pixel region. With the above-described structure, the area the gate signal line driving circuit occupies in prior art is removed to reduce the width (side to side) of the display device. Therefore a display device that has a small frame area in the lateral direction can be provided.

22 Claims, 18 Drawing Sheets

Related U.S. Application Data continuation of application No. 10/211,294, filed on Aug. 5, 2002, now Pat. No. 6,862,008.

(58) Field of Classification Search
USPC .............................. 345/204, 62, 205, 76, 92
See application file for complete search history.

(56) References Cited

U.S. PATENT DOCUMENTS

| | | |
|---|---|---|
| 5,694,061 A | 12/1997 | Morosawa et al. |
| 5,739,880 A * | 4/1998 | Suzuki et al. ................ 349/110 |
| 5,851,440 A * | 12/1998 | Tanaka et al. ................. 257/66 |
| 5,959,713 A * | 9/1999 | Kobayashi .................... 349/192 |
| 5,995,189 A | 11/1999 | Zhang |
| 6,008,801 A * | 12/1999 | Jeong ............................ 345/204 |
| 6,067,067 A * | 5/2000 | Park .............................. 345/100 |
| 6,091,393 A * | 7/2000 | Park .............................. 345/100 |
| 6,177,301 B1 * | 1/2001 | Jung ............................. 438/150 |
| 6,259,505 B1 * | 7/2001 | Makino ........................ 349/153 |
| 6,326,913 B1 * | 12/2001 | Chao et al. ................... 341/144 |
| 6,373,547 B2 * | 4/2002 | Saito et al. ................... 349/155 |
| 6,424,326 B2 | 7/2002 | Yamazaki et al. |
| 6,456,264 B1 | 9/2002 | Kang |
| 6,465,268 B2 | 10/2002 | Hirakata et al. |
| 6,473,147 B1 * | 10/2002 | Nakahara et al. ............ 349/153 |
| 6,475,836 B1 | 11/2002 | Suzawa |
| 6,498,049 B1 * | 12/2002 | Friend et al. ................... 438/34 |
| 6,501,227 B1 | 12/2002 | Koyama |
| 6,518,700 B1 * | 2/2003 | Friend et al. ................. 313/504 |
| 6,583,775 B1 * | 6/2003 | Sekiya et al. .................. 345/76 |
| 6,590,553 B1 | 7/2003 | Kimura |
| 6,603,446 B1 | 8/2003 | Kanazawa |
| 6,611,108 B2 | 8/2003 | Kimura |
| 6,641,933 B1 * | 11/2003 | Yamazaki et al. ............ 428/690 |
| 6,665,037 B2 * | 12/2003 | Hagiwara ..................... 349/148 |
| 6,693,385 B2 | 2/2004 | Koyama |
| 6,700,330 B2 | 3/2004 | Koyama |
| 6,720,944 B1 * | 4/2004 | Ishii et al. ...................... 345/87 |
| 6,741,315 B1 * | 5/2004 | Uchiyama ..................... 349/149 |
| 6,743,650 B2 * | 6/2004 | Hirakata et al. ................ 438/30 |
| 6,760,004 B2 | 7/2004 | Koyama |
| 6,771,238 B1 * | 8/2004 | Hiroki ............................. 345/87 |
| 6,812,974 B1 | 11/2004 | Hinata |
| 6,853,361 B2 * | 2/2005 | Tsuyuki et al. ................. 345/92 |
| 6,859,232 B1 * | 2/2005 | Tonami et al. ................ 348/302 |
| 6,862,008 B2 | 3/2005 | Yamazaki |
| 6,894,431 B2 | 5/2005 | Yamazaki |
| 6,894,758 B1 * | 5/2005 | Hagiwara et al. ............ 349/152 |
| 6,922,226 B2 * | 7/2005 | Park et al. ..................... 349/149 |
| 6,930,745 B1 * | 8/2005 | Miyazaki et al. ............. 349/153 |
| 7,019,718 B2 * | 3/2006 | Yamazaki et al. ............. 345/80 |
| 7,112,374 B2 | 9/2006 | Yamazaki et al. |
| 7,113,154 B1 * | 9/2006 | Inukai ............................ 345/76 |
| 7,199,855 B2 * | 4/2007 | Yoshimi et al. .............. 349/187 |
| 7,230,601 B2 * | 6/2007 | Yamazaki et al. ............. 345/92 |
| 7,250,927 B2 * | 7/2007 | Yamazaki et al. ............. 345/76 |
| 7,333,172 B1 * | 2/2008 | Zhang ........................... 349/153 |
| 7,359,027 B2 * | 4/2008 | Kim et al. .................... 349/153 |
| 7,463,322 B2 * | 12/2008 | Jin ................................ 349/129 |
| 7,573,469 B2 * | 8/2009 | Yamazaki et al. ............ 345/204 |
| 7,697,052 B1 * | 4/2010 | Yamazaki et al. ........ 348/333.01 |
| 7,714,967 B2 * | 5/2010 | Jin ................................ 349/129 |
| 7,796,224 B2 * | 9/2010 | Aota et al. .................... 349/139 |
| 8,035,793 B2 * | 10/2011 | Lee et al. ...................... 349/190 |
| 2001/0038367 A1 | 11/2001 | Inukai |
| 2002/0011975 A1 * | 1/2002 | Yamazaki et al. .............. 345/76 |
| 2002/0018060 A1 * | 2/2002 | Yamazaki et al. ............ 345/211 |
| 2002/0036604 A1 | 3/2002 | Yamazaki et al. |
| 2002/0135313 A1 | 9/2002 | Koyama |
| 2004/0207789 A1 | 10/2004 | Hirakata et al. |
| 2004/0218112 A1 | 11/2004 | Hirakata et al. |
| 2004/0263738 A1 * | 12/2004 | Jin ................................ 349/129 |
| 2005/0140578 A1 * | 6/2005 | Yamazaki et al. .............. 345/55 |
| 2006/0139562 A1 * | 6/2006 | Lee et al. ...................... 349/190 |
| 2007/0007870 A1 | 1/2007 | Yamazaki et al. |
| 2007/0040786 A1 * | 2/2007 | Chung ............................ 345/92 |
| 2007/0187692 A1 * | 8/2007 | Nakanishi ....................... 257/72 |
| 2008/0062373 A1 * | 3/2008 | Kim et al. .................... 349/151 |
| 2008/0151167 A1 * | 6/2008 | Aota et al. .................... 349/139 |
| 2008/0158453 A1 * | 7/2008 | Segawa et al. ................. 349/34 |
| 2009/0153786 A1 * | 6/2009 | Jin ................................ 349/129 |
| 2009/0153796 A1 * | 6/2009 | Rabner ......................... 351/201 |

FOREIGN PATENT DOCUMENTS

| | | |
|---|---|---|
| EP | 1 087 448 A2 | 3/2001 |
| EP | 1 713 054 A2 | 10/2006 |
| JP | 06-202124 | 7/1994 |
| JP | 09-018011 A | 1/1997 |
| JP | 10-319440 A | 12/1998 |
| JP | 11288001 A | 10/1999 |
| JP | 11-305681 A | 11/1999 |
| JP | 2001-159878 A | 6/2001 |
| JP | 2001-214159 A | 8/2001 |
| KR | 2000-0035327 | 6/2000 |
| KR | 2001-0014771 | 2/2001 |
| KR | 2001-0043384 | 5/2001 |
| KR | 2001-0070175 | 7/2001 |

* cited by examiner

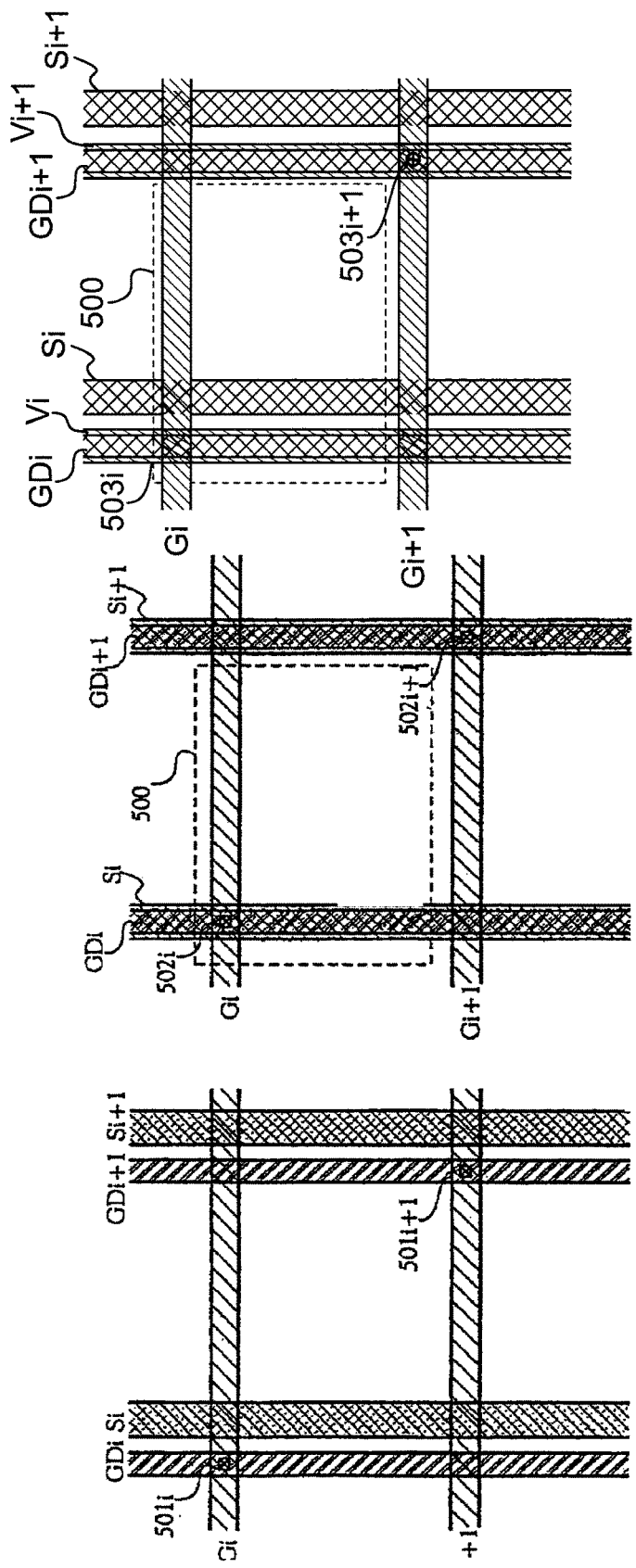

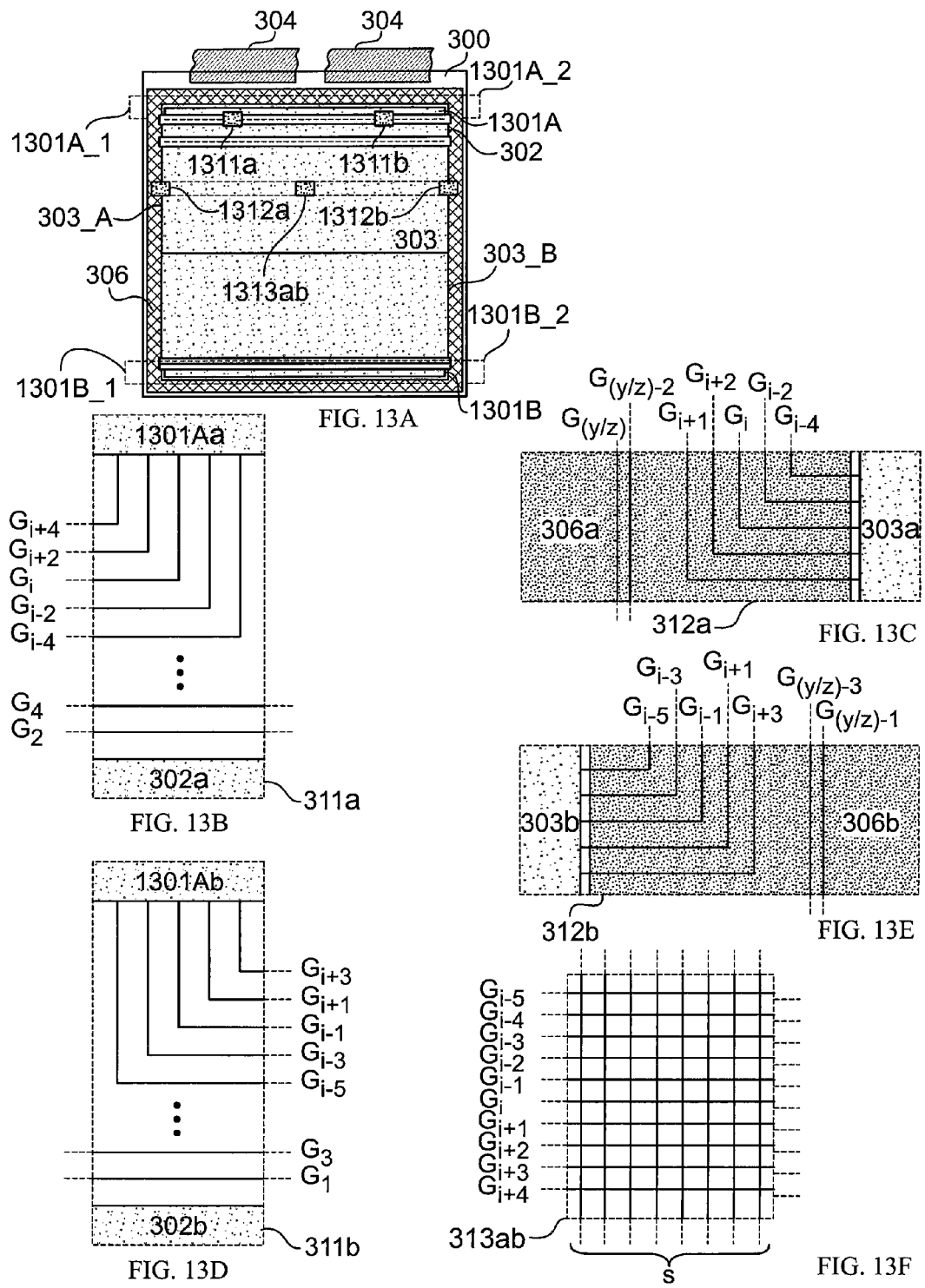

DISPLAY DEVICE

CROSS-REFERENCE TO RELATED APPLICATIONS

This application is a divisional of U.S. application Ser. No. 11/041,454, filed Jan. 25, 2005, now allowed, which is a continuation of U.S. application Ser. No. 10/211,294, filed Aug. 5, 2002, now U.S. Pat. No. 6,862,008, which claims the benefit of a foreign priority application filed in Japan as Serial No. 2001-241463 on Aug. 8, 2001, all of which are incorporated by reference.

BACKGROUND OF THE INVENTION

1. Field of the Invention

The present invention relates to a display device in which a plurality of pixels are formed on an insulating surface and the luminance of the pixels is changed to display an image. Specifically, the present invention relates to a display device in which a driving circuit for controlling the luminance of pixels is provided on the same insulating surface where the pixels are formed.

2. Description of the Related Art

Display devices are incorporated in various electronic equipment. Reduction in size and power consumption is required for display devices, particularly for ones that are used in portable information equipment.

Display devices that are attracting attention for their reduced size and power consumption are flat panel displays such as liquid crystal display devices and OLED display devices using OLED (organic light emitting diode) elements.

These flat panel displays each have a plurality of pixels that form a matrix pattern on a substrate having an insulating surface. The flat panel displays form an image by using a driving circuit to selectively input a video signal to one pixel and change the luminance of the pixel.

There are various ways to connect pixels to a driving circuit.

As one way to connect pixels to a driving circuit for controlling the luminance of the pixels, the driving circuit is formed on a separate substrate such as a single crystal IC substrate and the substrate is bonded to the top face of a substrate having an insulating surface on which the pixels are formed. In this case, a large area is needed to bond the single crystal IC substrate to the substrate having an insulating surface on which the pixels are formed. In addition, the wiring resistance between the driving circuit and the pixels is large. Therefore it is difficult to provide a display device that is small in size and power consumption.

In another way to connect pixels to a driving circuit, the driving circuit is integrally formed on the same insulating surface where the pixels are formed. The driving circuit is composed of a thin film transistor (TFT) on the same insulating surface where the pixels are formed. This method can provide a display device that is small in size and power consumption.

FIG. 9 shows a top view of a display device having a pixel region in which a plurality of pixels form a matrix pattern and driving circuits that are formed in the periphery of the pixel region.

A source signal line driving circuit 902, gate signal line driving circuits 901 (901A and 901B), and a pixel region 903 are placed on a substrate 900 having an insulating surface. Signals to be inputted to the driving circuits (source signal line driving circuit 902 and gate signal line driving circuits 901) are supplied from an FPC substrate 904.

When viewed from above, a region of the display device excluding the pixel region 903 is referred to as frame. In other words, a frame in a display device corresponds to a region that does not display an image.

In a liquid crystal display device, the luminance of each pixel is determined by controlling the transmittance, which is achieved by controlling the orientation of each liquid crystal element. A liquid crystal element has a liquid crystal material placed between two electrodes. One of the electrodes of the liquid crystal element (hereinafter referred to as pixel electrode) is formed on a substrate on which a driving circuit and other components are formed (hereinafter referred to as pixel substrate) and the other electrode of the liquid crystal element (opposite electrode) is formed on a separate substrate (hereinafter referred to as opposite substrate). The pixel substrate and the opposite substrate are bonded to each other such that the pixel electrode faces the opposite electrode.

On the pixel substrate, a seal member is arranged so as to surround the pixel region and the driving circuits and then the opposite substrate is bonded. A liquid crystal material is sealed in the space surrounded by the pixel substrate, the opposite substrate, and the seal member. When the display device shown in FIG. 9 is a liquid crystal display device, 906 is the seal member used to bond the pixel substrate 900 to the opposite substrate. The opposite substrate and the liquid crystal material are not shown in FIG. 9.

In an OLED display device, the luminance of each pixel is determined by controlling light emission of each OLED element. An OLED element is formed on a pixel substrate after TFTs constituting a driving circuit and other components are formed. An OLED element is by nature degraded considerably by oxygen, moisture, and the like when it is brought into contact with the outside air. For that reason, the OLED display device employs a structure in which a cover member is placed after an OLED element is formed to shut the OLED element off of the outside air. The cover member is bonded to the top face of the pixel substrate using a seal member.

On the pixel substrate, the seal member is arranged so as to surround the pixel region and the driving circuits and then the cover member is bonded. The OLED element is sealed in the space surrounded by the pixel substrate, the cover member, and the seal member. When the display device shown in FIG. 9 is an OLED display device, 906 is the seal member. The cover member is not shown in FIG. 9.

It is common to various display devices including liquid crystal display devices and OLED display devices that the pixel region 903 has x (x is a natural number) source signal lines S1 to Sx arranged in parallel with one another and y (y is a natural number) gate signal lines G1 to Gy which are arranged in parallel with one another and which are perpendicular to the source signal lines S1 to Sx. Through the source signal lines S1 to Sx and gate signal lines G1 to Gy, pixels are selected and the luminance of the pixels selected is controlled.

The source signal line driving circuit 902 inputs signals to the plural source signal lines S1 to Sx. The gate signal line driving circuits 901 (901A and 901B) input signals to the plural gate signal lines G1 to Gy. The driving circuits 902 and 901 are formed in the periphery of the pixel region 903.

The source signal line driving circuit 902, which is composed of a shift register and other components, outputs signals sequentially in a scanning direction indicated by the arrow in the drawing. The signals outputted are inputted to the plural source signal lines S1 to Sx. Usually, the source signal line driving circuit 902 is arranged such that the scanning direction is perpendicular to the source signal lines S1 to Sx that are arranged in parallel to one another. Similarly, the gate signal line driving circuits 901, which are composed of a shift register and other components, output signals sequentially in a scanning direction indicated by the arrow in the drawing. The signals outputted are inputted to the plural gate signal lines G1 to Gy. Usually, the gate signal line driving circuits 901 are arranged such that the scanning direction is perpendicular to the gate signal lines G1 to Gy that are arranged in parallel to one another.

In FIG. 9, the gate signal line driving circuits 901 (901A and 901B) are formed to the left and right of the pixel region. Alternatively, only one side of the pixel region may have a gate signal line driving circuit.

The scanning direction of the gate signal line driving circuits 901 arranged as described above is called a row direction whereas the scanning direction of the source signal line driving circuit 902 is called a column direction.

In FIG. 9, the source signal line driving circuit 902 is formed in parallel to one of four sides of the rectangle of the pixel region 903. The gate signal line driving circuits 901A and 901B are each formed in parallel to one of two sides of the rectangle, which are different from the side parallel to the source signal line driving circuit 902 and which are not opposed to the source signal line driving circuit 902.

In this specification, of four sides of the pixel region 903 on the pixel substrate 900, the side connected to the FPC substrate 904 is called an upper side and the side opposing to the upper side is called a lower side.

Of four sides of the pixel region 903 on the pixel substrate 900, one side that is abutted with the side connected to the FPC substrate 904, and the side opposite to the one side are called a left side and right side of the pixel region, respectively.

Usually, the place of the source signal line driving circuit 902 is the closest to the area where the FPC substrate is bonded. Therefore the source signal line driving circuit 902 is generally placed above the pixel region 903. On the other hand, the gate signal line driving circuits 901 are placed to the left and right of the pixel region 903 on the pixel substrate 900.

Out of the four sides of the pixel region 903 on the pixel substrate 900, the source signal line driving circuit 902 may be placed on the side opposite to the side where the FPC substrate 904 is connected. In this case, the place of the source signal line driving circuit is below the pixel region.

It is assumed that above, below, left, and right of the pixel region 903 correspond to above, below, left, and right of the display device, respectively.

Users of portable information equipment such as cellular phones demand as large a screen as possible for displaying an image and reduction in width of equipment body so that it is easy to hold.

In order to obtain as large a display screen as possible and reduce the width of equipment body as much as possible, the area of the frame of a display device incorporated in the equipment body has to be reduced.

In the display device structured as shown in FIG. 9, the gate signal line driving circuits 901A and 901B are placed to the left and right of the pixel region 903.

Furthermore, the seal member 906 is formed on the outside of the gate signal line driving circuits 901A and 901B on the pixel substrate 900. Accordingly, the area of the frame on the left and right of the display device cannot be reduced.

Also, the area of the frame can be reduced only to a limited degree on the upper and lower sides of the pixel region since the FPC substrate is connected.

SUMMARY OF THE INVENTION

The present invention has been made in view of the above, and an object of the present invention is therefore to provide a display device which has driving circuits for supplying signals to a plurality of pixels on the same insulating surface where the plural pixels are formed and which has reduced frame area on its left and right sides.

The present invention provides a display device with driving circuits for supplying signals to a plurality of pixels being formed on the same insulating surface where the plural pixels are formed in which a first driving circuit (gate signal line driving circuit) is in parallel with a second driving circuit (source signal line driving circuit). In this way, no driving circuits are placed in at least two opposing directions out of four directions with respect to a pixel region, thereby obtaining a display device with the frame area reduced on its left and right sides.

Here, to place a gate signal line driving circuit and a source signal line driving circuit in parallel to each other means that the scanning direction of the gate signal line is in parallel to the scanning direction of the source signal line driving circuit.

In this specification, a scanning direction of a driving circuit means the direction of aligning circuits each associated with one of plural signal lines to which signals are inputted from the driving circuit.

In general, it is desirable if signals outputted from a source signal line driving circuit are inputted to a pixel region through as short a distance as possible. Accordingly, when a source signal line driving circuit and a gate signal line driving circuit are formed on the same side of a pixel region, the source signal line driving circuit is arranged so as to be closer to the pixel region than the gate signal line driving circuit.

It is also possible to place the gate signal line driving circuit nearer to the pixel region than the source signal line driving circuit.

Alternatively, the source signal line driving circuit is placed only above or below the pixel region whereas the gate signal line driving circuit is placed only on a side of the pixel region which is opposite to the side where the source signal line driving circuit is formed.

When the source signal line driving circuit and the gate signal line driving circuit are arranged as described above, the following structures are employed to sequentially scan the gate signal lines in the pixel region.

In a first structure, the gate signal line driving circuit outputs signals to lead-out gate signal lines that are perpendicular to the gate signal lines in the pixel region.

If the gate signal line driving circuit and the source signal line driving circuit are on the same side of the pixel region while placing the source signal line driving circuit nearer to the pixel region than the gate signal line driving circuit, the lead-out gate signal lines are led into the pixel region piercing through the source signal line driving circuit that is interposed between the gate signal line driving circuit and the pixel region.

The lead-out gate signal lines are respectively connected to their associated gate signal lines in the pixel region. In this way, the gate signal line driving circuit sequentially inputs signals to the gate signal lines in the pixel region.

In the pixel region, the lead-out gate signal lines connected to the gate signal lines may be formed on the same layer where the gate signal lines are formed or may be formed on a different layer.

The lead-out gate signal lines are in parallel with the source signal lines in the pixel region. By forming the lead-out gate signal lines so as to overlap the parallel wiring lines, the aperture ratio can be increased.

In a second structure, an output of the gate signal line driving circuit is led into the pixel region in a lateral direction.

In this case, a seal member can be placed above the gate signal lines. The area the wiring lines occupy is thus reduced and the area of the frame in the lateral direction of the display device is reduced accordingly.

With the above-described structures, the area the gate signal line driving circuit occupies in prior art is removed to reduce the width (side to side) of the display device. Therefore a display device that has a small frame area in the lateral direction can be provided.

BRIEF DESCRIPTION OF THE DRAWINGS

In the accompanying drawings:

FIGS. 5A to 5C are diagrams showing the wiring structure of a pixel of a display device according to the present invention;

FIGS. 13A to 13F are diagrams showing the structure of a display device according to Embodiment 4;

DETAILED DESCRIPTION OF THE PREFERRED EMBODIMENTS

Embodiment Mode 1

In a display device with driving circuits (a source signal line driving circuit and a gate signal line driving circuit) for controlling signals to be inputted to a plurality of pixels being formed on the same insulating surface where the plural pixels are formed, the gate signal line driving circuit and the source signal line driving circuit are placed on the same side out of four sides of a pixel region. The source signal line driving circuit is placed nearer to the pixel region than the gate signal line driving circuit, and signals from the gate signal line driving circuit are inputted to the pixel region through the source signal line driving circuit.

No driving circuits (source signal line driving circuit and gate signal line driving circuit) are placed to the left and right of the pixel region.

Figure 1A:
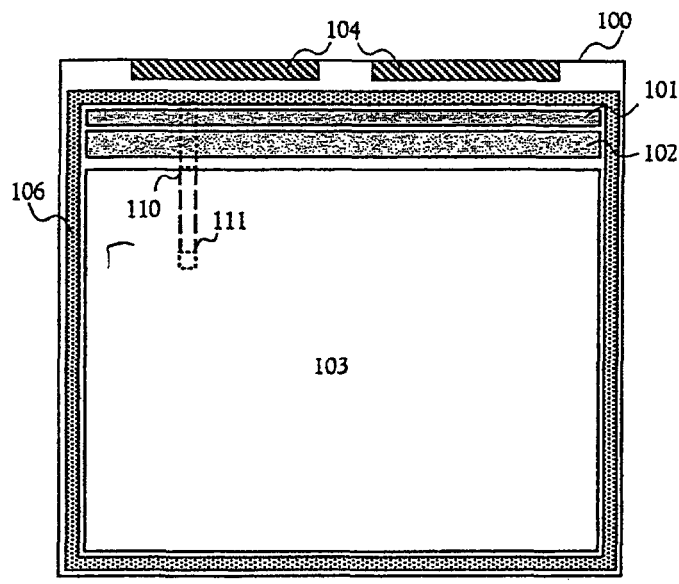
FIGS. 1A to 1C are diagrams showing a structure of a display device according to the present invention.
Figure 1B:
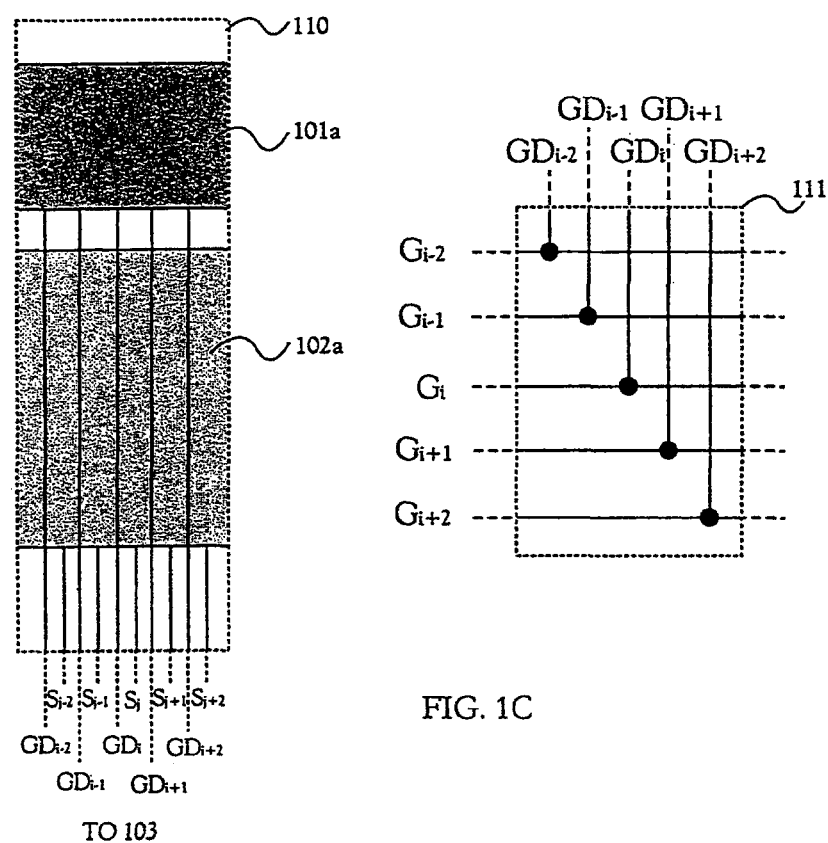
Figure 1C:
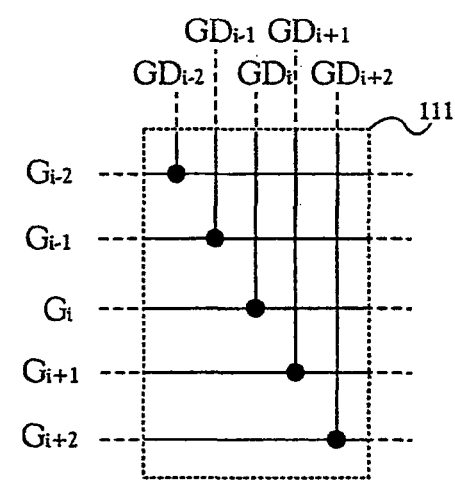

FIGS. 1A to 1C show a structure of Embodiment Mode 1 of the present invention.

FIG. 1A is a top view showing the structure of a display device. The display device has a pixel substrate 100 on which a pixel region 103, a source signal line driving circuit 102, a gate signal line driving circuit 101, an FPC substrate 104, and a seal member 106 are arranged.

The source signal line driving circuit 102 is formed above the pixel region 103. The gate signal line driving circuit 101 is formed above the pixel region 103 in parallel to the source signal line driving circuit 102.

A detailed structure of a region denoted by 110 in FIG. 1A is shown in FIG. 1B and a detailed structure of a region denoted by 111 is shown in FIG. 1C.

Denoted by 101a in FIG. 1B is a part of the gate signal line driving circuit 101. 102a denotes a part of the source signal line driving circuit 102. In the pixel region here, x (x is a natural number) source signal lines and y (y is a natural number) gate signal lines are arranged.

In the region 110, signals outputted from the gate signal line driving circuit 101a are inputted to lead-out gate signal lines GDi−2 to GDi+2 (i is a natural number equal to or larger than 3). The lead-out gate signal lines GDi−2 to GDi+2 are led into the pixel region 103 while piercing through the source signal line driving circuit 102a. The source signal line driving circuit 102a outputs signals to source signal lines Sj−2 to Sj+2 (j is a natural number equal to or larger than 3). The source signal lines Sj−2 to Sj+2 are arranged in parallel to the lead-out gate signal lines GDi−2 to GDi+2.

The signal lines led from the source signal line driving circuit into the pixel region may be called lead-out source signal lines and discriminated from the source signal lines arranged in the pixel region 103. However, the lead-out source signal lines and the source signal lines in the pixel region here are generically called as source signal lines for the sake of explanation.

In the region 111 shown in FIG. 1C, the lead-out gate signal lines GDi−2 to GDi+2 led into the pixel region 103 are connected to the gate signal lines Gi−2 to Gi+2, respectively.

The source signal lines and others are not shown in FIG. 1C.

Similar to the region 110, signals are inputted from the whole gate signal line driving circuit 101 to all of the lead-out gate signal lines GD1 to GDz (z is a natural number) to input the signals to the pixel region. Signals are inputted from the whole source signal line driving circuit 102 to the source signal lines S1 to Sx to input the signals to the pixel region 103. Similar to the region 111, the gate signal lines G1 to Gy are associated with and connected to the lead-out gate signal lines GD1 to GDz, respectively, in the pixel region 103.

Here, it is assumed that the number of lead-out gate signal lines, z, is identical with the number of gate signal lines, y.

Generally, the number of source signal lines, x, is different from the number of gate signal lines, y. If the number x of the source signal lines is larger than the number y of the gate signal lines, there are an area where the source signal lines and lead-out gate signal lines are alternately led into the pixel region and an area where the source signal lines alone are led into the pixel region. Otherwise, the wiring line interval of the lead-out gate signal lines is wider than the wiring line interval of the source signal lines.

The states described above can cause fluctuation in luminance between pixels when the aperture ratio of pixels matters in a transmissive display device. Then the number of lead-out gate signal lines, z, may be set equal to the number of source signal lines, x, and (x−y) lead-out gate signal lines serve as dummy wiring lines to which no signals are inputted.

A first structure of Embodiment Mode 1 will be described in which lead-out gate signal lines are formed on the same layer where gate signal lines are formed.

Figure 2A:
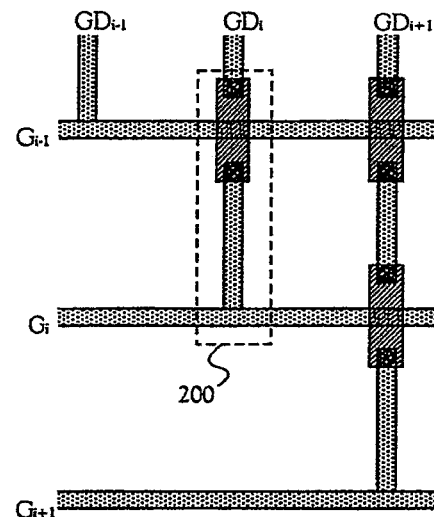
FIGS. 2A and 2B are diagrams showing a wiring structure of a pixel of a display device according to the present invention.
Figure 2B:
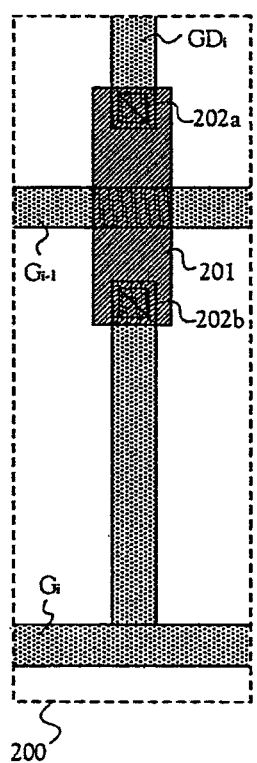

FIGS. 2A and 2B are top views showing a structure of a part of a pixel region.

In FIG. 2A, lead-out gate signal lines GDi−1 to GDi+1 and gate signal lines Gi−1 to Gi+1 are formed on the same layer. The gate signal line Gi is connected to the lead-out gate signal line GDi. On the other hand, the gate signal line Gi is not connected to a lead-out gate signal line GDj (j is a natural number equal to or less than y but not equal to i) and the lines Gi and GDj intersect each other through a wiring line formed on a layer different from the layer where the gate signal line Gi is formed.

In this way, the lead-out gate signal lines GD1 to GDy are connected to the gate signal lines G1 to Gy, respectively, throughout the pixel region.

FIG. 2B is an enlarged view of a region denoted by 200 in FIG. 2A.

The lead-out gate signal line GDi intersects the gate signal line Gi−1 through a wiring line 201 formed on a layer different from the layer on which the gate signal lines Gi and Gi−1 are formed. In other words, before intersecting the gate signal line Gi−1, the lead-out gate signal line GDi that is formed on the same layer where the gate signal line Gi−1 is formed is connected to the wiring line 201 by a contact hole 202a. After the lead-out gate signal line GDi intersects the gate signal line Gi−1, the wiring line 201 is again connected by a contact hole 202b to the lead-out wiring line GDi that is formed on the same layer where the gate signal line Gi−1 is formed. The lead-out gate signal line GDi and the gate signal line Gi are connected to each other in this way.

The structure shown in FIGS. 2A and 2B is effective for a display device in which emitted light does not travel through a pixel substrate to be viewed, such as reflective liquid crystal display devices and upward emission OLED display devices.

Described next is a second structure of Embodiment Mode 1 in which lead-out gate signal lines and gate signal lines are formed on different layers. The description will be given with reference to FIGS. 5A to 5C.

FIGS. 5A to 5C are top views showing the structure of a part of a pixel region.

As shown in FIG. 5A, the lead-out gate signal lines GDi and GDi+1 are formed on a layer different from the layer on which the gate signal lines Gi and Gi+1 are formed. Wiring lines other than lead-out gate signal lines and gate signal lines are not shown in FIG. 5A.

The lead-out gate signal line GDi and the gate signal line Gi are connected to each other through a contact hole 501i. Similarly, the lead-out gate signal line GDi+1 and the gate signal line Gi+1 are connected to each other through a contact hole 501i+1.

FIG. 5B shows an example in which source signal lines Si and Si+1 are arranged so as to overlap the lead-out gate signal lines GDi and GDi+1. In this case, the source signal lines Si and Si+1, the gate signal lines Gi and Gi+1, and the lead-out gate signal lines GDi and GDi+1 are formed on three different layers. One pixel is denoted by 500.

The lead-out gate signal line GDi and the gate signal line Gi are connected to each other through a contact hole 502i. Similarly, the lead-out gate signal line GDi+1 and the gate signal line Gi+1 are connected to each other through a contact hole 502i+1.

In the structure of FIG. 5B where the power supply lines are arranged to overlap the lead-out gate signal lines, the aperture ratio of pixels can be raised. The structure shown in FIG. 5B is effective for a display device in which light viewed is emitted through a pixel substrate, such as transmissive liquid crystal display devices and downward emission OLED display devices.

FIG. 5C shows an example in which power supply lines Vi and Vi+1 are arranged so as to overlap the lead-out gate signal lines GDi and GDi+1. In this case, the power supply lines Vi and Vi+1, the gate signal lines Gi and Gi+1, and the lead-out gate signal lines GDi and GDi+1 are formed on three different layers. The power supply lines Vi and Vi+1 and the source signal lines Si and Si+1 may be formed on the same layer or different layers. One pixel is denoted by 500.

The lead-out gate signal line GDi and the gate signal line Gi are connected to each other through a contact hole 503i. Similarly, the lead-out gate signal line GDi+1 and the gate signal line Gi+1 are connected to each other through a contact hole 503i+1.

In the structure of FIG. 5C where the power supply lines are arranged to overlap the lead-out gate signal lines, the aperture ratio of pixels can be raised. The structure shown in FIG. 5C is effective for a display device in which light viewed is emitted through a pixel substrate, such as transmissive liquid crystal display devices and downward emission OLED display devices.

In Embodiment Mode 1, the gate signal line driving circuit is placed above the source signal line driving circuit so that the source signal line driving circuit comes nearer to the pixel region than the gate signal line driving circuit. Alternatively, the gate signal line driving circuit may be placed nearer to the pixel region than the source signal line driving circuit.

In the display device shown in Embodiment Mode 1, the distance along which the lead-out gate signal lines are led can be shortened. Accordingly, Embodiment Mode 1 is effective for a display device whose pixel region has a relatively large area.

This embodiment mode can be applied freely to display devices of any structure as long as it has pixels driven by a driving circuit for selecting a pixel column (source signal line driving circuit) and a driving circuit for selecting a pixel row (gate signal line driving circuit). For example, this embodiment mode is applicable to liquid crystal display devices and OLED display devices.

Pixels of a display device according to this embodiment mode can be of any known structure as long as they are wired to signal lines for selecting a pixel column (source signal lines) and signal lines for selecting a pixel row (gate signal lines). Also, this embodiment mode can employ driving circuits of any known structure for the source signal line driving circuit and the gate signal line driving circuit.

For instance, the gate signal line driving circuit may be of the type that is composed of a shift register and other components to output signals sequentially, or the type that is composed of a decoder and other components to output signals sequentially in an arbitrary order.

Embodiment Mode 2

According to Embodiment Mode 2, in a display device with driving circuits (a source signal line driving circuit and a gate signal line driving circuit) for controlling signals to be inputted to a plurality of pixels being formed on the same insulating surface where the plural pixels are formed, the gate signal line driving circuit is arranged in parallel to the source signal line driving circuit and a signal output from the gate signal line driving circuit is led through the periphery of the source signal line driving circuit and the periphery of a pixel region to be inputted to gate signal lines in the pixel region in a lateral direction. A schematic diagram of the display device structured as above is shown in FIG. 4.

Figure 4:
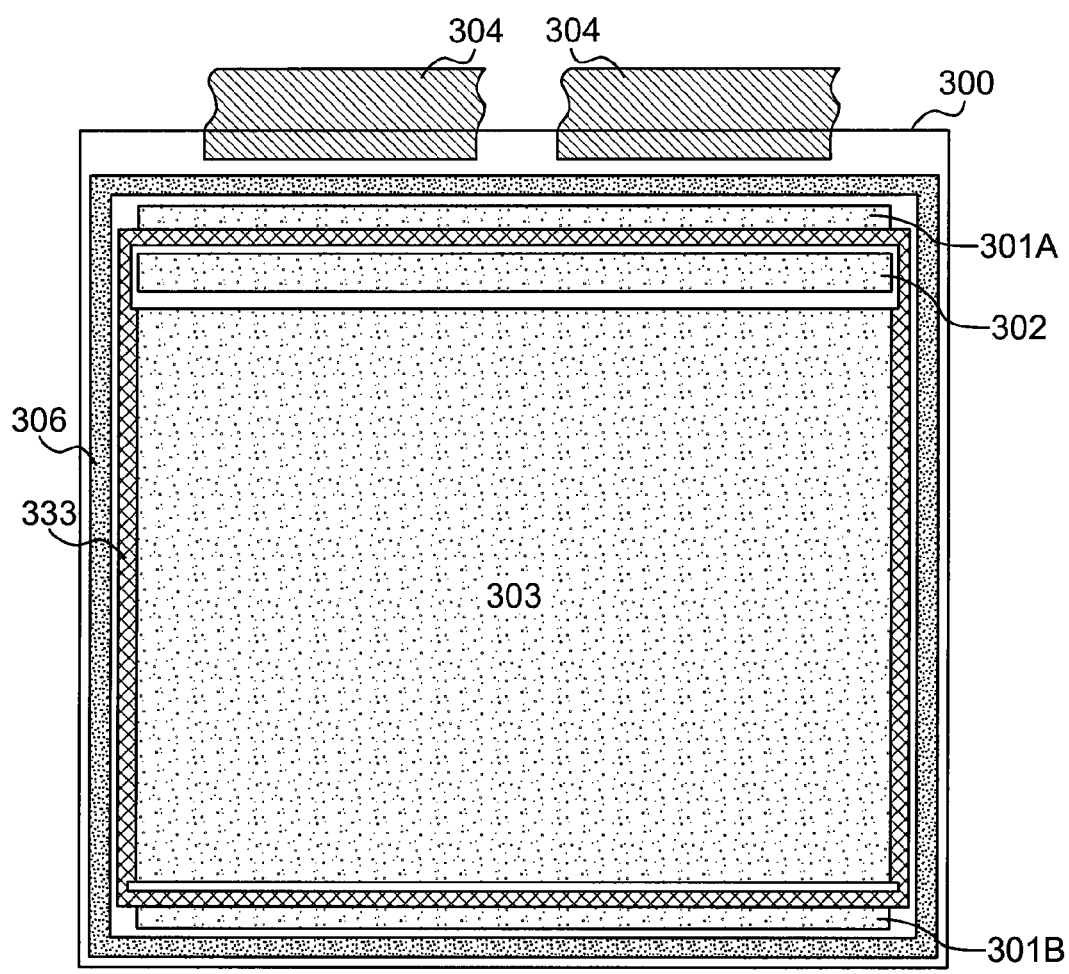
FIG. 4 is a schematic diagram showing the structure of a display device according to the present invention.

In FIG. 4, the display device has a pixel substrate 300 on which gate signal line driving circuits 301 (301A and 301B), a source signal line driving circuit 302, a pixel region 303, an FPC substrate 304, and a seal member 306 are arranged.

The gate signal line driving circuits 301 (301A and 301B) are placed above and below the pixel region 303 in parallel to the source signal line driving circuit 302. Output signals of the gate signal line driving circuits are inputted to gate signal lines in the pixel region 303 from the left and right of the pixel region 303 through wiring lines led in a region denoted by 333 in FIG. 4.

Alternatively, only one gate signal line driving circuit 301 may be placed above or below the pixel region 303.

If the seal member overlaps the gate signal lines that are led through the left and right of the pixel region 303, the lateral frame area of the display device can be reduced even more.

The signal lines led from the gate signal line driving circuits into the pixel region may be called lead-out gate signal lines and discriminated from the gate signal lines arranged in the pixel region 303. However, the lead-out gate signal lines and the gate signal lines in the pixel region here are generically called as gate signal lines for the sake of explanation.

FIGS. 15A to 15D are schematic diagrams showing an example in which gate signal lines led out and a seal member are arranged to overlap each other.

Figure 15B:
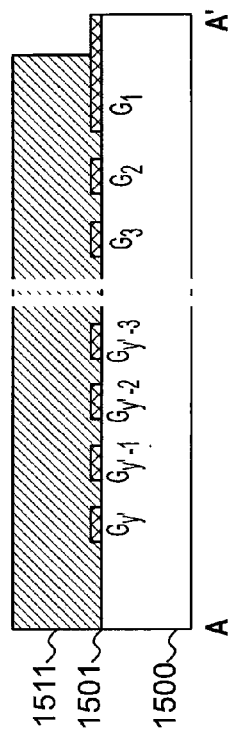
FIGS. 15A to 15D are diagrams showing the structure of a seal member and a led-out part of gate signal lines in a display device of the present invention.
Figure 15D:
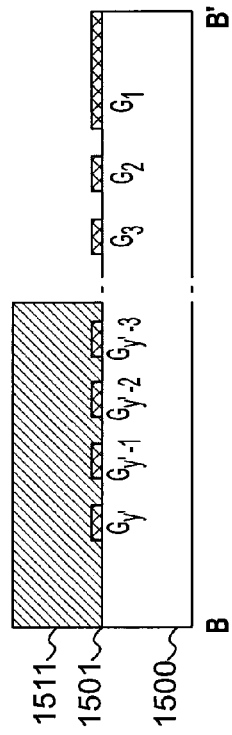
Figure 15A:
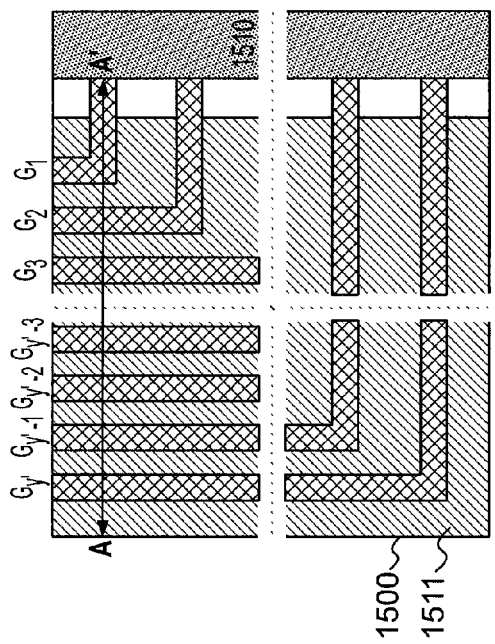

FIG. 15A is a top view of gate signal lines led through the left of a pixel region. Gate signal lines G1 to Gy' are arranged in parallel to one another and led through areas to the left of the pixel region 1510 into the pixel region 1510. A seal member 1511 is formed above the gate signal lines G1 to Gy'. FIG. 15B is a sectional view taken along the line A-A' in FIG. 15A. In FIG. 15B, the gate signal lines G1 to Gy' are formed on an insulating surface 1501 on a pixel substrate 1500. The seal member 1511 is formed on the gate signal lines G1 to Gy'.

Figure 15C:
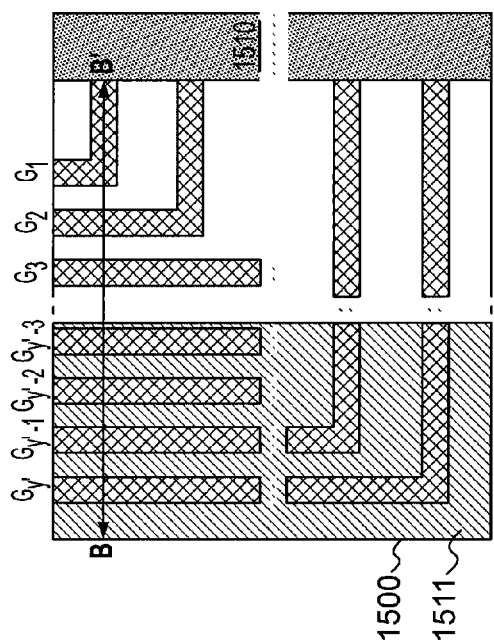

The gate signal lines G1 to Gy' that are arranged in parallel to one another by the side of the pixel region 1510 may all overlap the seal member 1511 as shown in FIGS. 15A and 15B. Alternatively, only some of the gate signal lines G1 to Gy' that are arranged in parallel to one another by the side of the pixel region 1510 may overlap the seal member 1511. FIG. 15C shows a top view of a structure in which only some of the gate signal lines G1 to Gy' which are arranged in parallel to one another and which are led by the side of the pixel region 1510 overlap the seal member 1511. A sectional view taken along the line B-B' in FIG. 15C is shown in FIG. 15D. In FIGS. 15C and 15D, components that are identical with those in FIGS. 15A and 15B are denoted by the same reference symbols and explanations thereof are omitted.

FIGS. 15A to 15D show a structure in which a seal member is in contact with gate signal lines. However, the seal member and the gate signal lines may overlap each other while sandwiching an interlayer film or the like therebetween.

If the display device shown in FIGS. 15A to 15D is a liquid crystal display device, an opposite substrate, an orientated film, a liquid crystal material, and the like are omitted from the drawings. If the display device shown in FIGS. 15A to 15D is an OLED display device, a cover member and the like are omitted from the drawings.

The above-mentioned structure in which the led-out portions of the gate signal lines are arranged to overlap the seal member makes it possible to reduce the frame area even when the display device has a large number of gate signal lines.

FIGS. 3A to 3J show an example of specific structure of a display device according to Embodiment Mode 2.

Figure 3A:
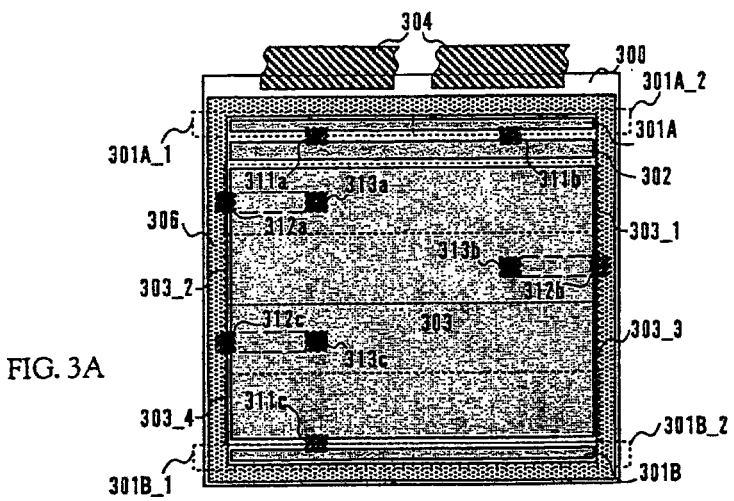
FIGS. 3A to 3J are diagrams showing the structure of a display device according to the present invention.

In FIG. 3A, components that are identical with those in FIG. 4 are denoted by the same reference symbols and explanations thereof are omitted.

The gate signal line driving circuit 301A is placed above the source signal line driving circuit 302, which is placed above the pixel region 303. The gate signal line driving circuit 301B is placed below the pixel region 303.

Output signals of the gate signal line driving circuits 301A and 301B are led through the periphery of the source signal line driving circuit 302 and the periphery of the pixel region 303 to be inputted to the pixel region 303.

A detailed description will be given with reference to FIGS. 3B to 3J on a specific example of leading gate signal lines for inputting output signals of the gate signal line driving circuits 301A and 301B to the pixel region.

The number of gate signal lines placed in the pixel region is represented by y (y is a natural number). Here, y is a multiple of 4 for the sake of explanation, but the present invention is not limited thereto.

The gate signal line driving circuit 301A is divided into two blocks, 301A_1 and 301A_2. The gate signal line driving circuit 301B is divided into two blocks, 301B_1 and 301B_2. The gate signal line driving circuit 301A_1 is a circuit for inputting signals to the first to y/4-th gate signal lines G1 to G(y/4) placed in the pixel region 303. An area of the pixel region where the gate signal lines G1 to G(y/4) are placed is denoted by 303_1. The gate signal line driving circuit 301A_2 is a circuit for inputting signals to the (y/4+1)-th to (y/2)-th gate signal lines G(y/4+1) to G(y/2) placed in the pixel region 303. An area of the pixel region where the gate signal lines G(y/4+1) to G(y/2) are placed is denoted by 303_2. The gate signal line driving circuit 301B_1 is a circuit for inputting signals to the (y/2+1)-th to (3y/4)-th gate signal lines G(y/2+1) to G(3y/4) placed in the pixel region 303. An area of the pixel region where the gate signal lines G(y/2+1) to G(3y/4) are placed is denoted by 303_3. The gate signal line driving circuit 301B_2 is a circuit for inputting signals to the (3y/4+1)-th to y-th gate signal lines G (3y/4+1) to Gy placed in the pixel region 303. An area of the pixel region where the gate signal lines G(3y/4+1) to Gy are placed is denoted by 303_4.

Figure 3B:
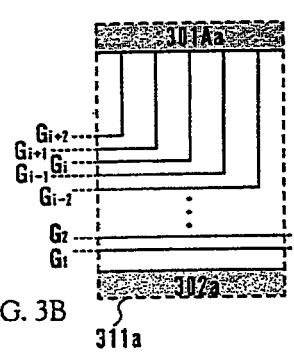
Figure 3C:
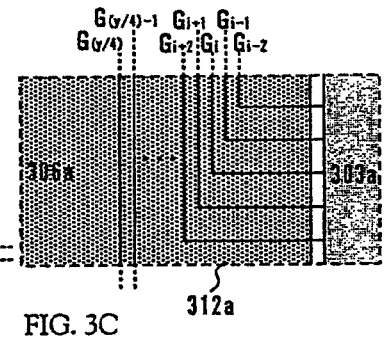
Figure 3D:
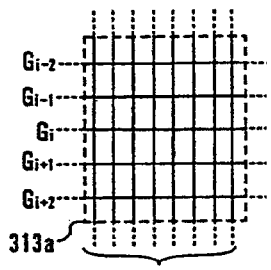

First, a detailed description is given about wiring lines for inputting output signals of the gate signal line driving circuit 301A_1 to the region 303_1. FIGS. 3B to 3D respectively show detailed structures of regions denoted by 311a, 312a, and 313a in FIG. 3A.

As shown in FIG. 3B, signals outputted from a part of the gate signal line driving circuit 301A_1, namely, 301Aa, are inputted to the gate signal lines Gi−2 to Gi+2. The gate signal lines Gi−2 to Gi+2 can change their direction between the gate signal line driving circuit 301Aa and a part of the source signal line driving circuit 302, namely, 302a. In this way, signals outputted from the gate signal line driving circuit 301A_1 are led to the left end of the source signal line driving circuit 302 through the gate signal lines G1 to G(y/4) that are formed in parallel with one another between the source signal line driving circuit 302 and the gate signal line driving circuit 301A_1. Once the gate signal lines G1 to G(y/4) are led to the left end of the source signal line driving circuit 302, their direction is changed and signals are led through the left region of the pixel region 303 that overlaps the seal member 306 to the left side of the region 303_1 to be inputted to the region 303_1. FIG. 3C shows a part of the seal member 306, 306a, and a part of the region 303_1, 303a. As shown in FIG. 3D, signals are thus inputted to the gate signal lines Gi−2 to Gi+2 that are perpendicular to the source signal lines (represented by S in the drawing) in the pixel region 303_1.

Figure 3E:
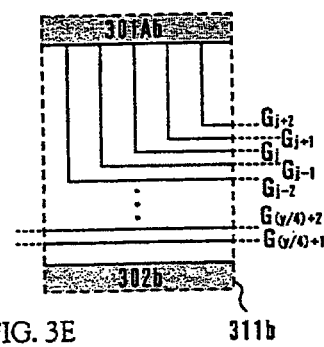
Figure 3F:
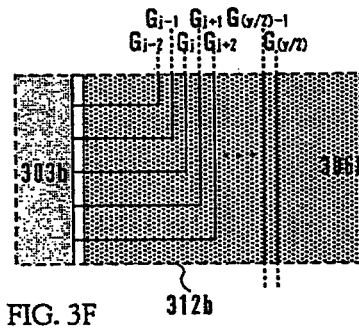
Figure 3G:
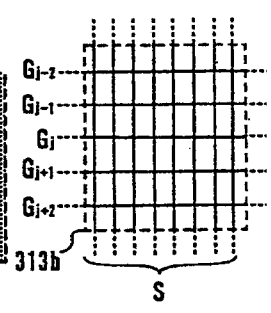

Next, a detailed description is given about wiring lines for inputting output signals of the gate signal line driving circuit 301A_2 to the region 303_2. FIGS. 3E to 3G respectively show detailed structures of regions denoted by 311b, 312b, and 313b in FIG. 3A.

As shown in FIG. 3E, signals outputted from a part of the gate signal line driving circuit 301A_2, namely, 301Ab, are inputted to the gate signal lines Gj−2 to Gj+2. The gate signal lines Gj−2 to Gj+2 can change their direction between the gate signal line driving circuit 301Ab and a part of the source signal line driving circuit 302, namely, 302b. In this way, signals outputted from the gate signal line driving circuit 301A_2 are led to the right end of the source signal line driving circuit 302 through the gate signal lines G(y/4)+1 to G(y/2) that are formed in parallel with one another between the source signal line driving circuit 302 and the gate signal line driving circuit 301A_2. Once the gate signal lines G1 to G(y/4) are led to the right end of the source signal line driving circuit 302, their direction is changed and signals are led through the right region of the pixel region 303 that overlaps the seal member 306 to the right side of the region 303_2 to be inputted to the region 303_2. FIG. 1F shows a part of the seal member 306, 306b, and a part of the region 303_1, 303b. As shown in FIG. 3G, signals are thus inputted to the gate signal lines Gj−2 to Gj+2 that are perpendicular to the source signal lines (represented by S in the drawing) in the pixel region 303_2.

Figure 3H:
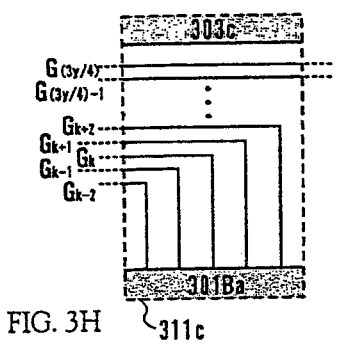
Figure 3I:
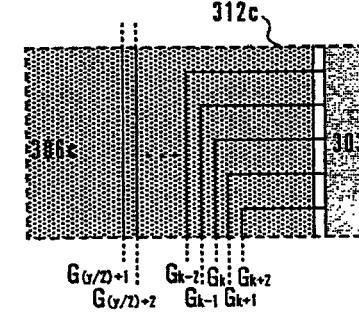
Figure 3J:
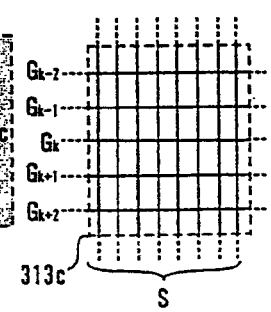

A detailed description is given about wiring lines for inputting output signals of the gate signal line driving circuit 301B_1 to the region 303_3. FIGS. 3H to 3J respectively show detailed structures of regions denoted by 311c, 312c, and 313c in FIG. 3A.

As shown in FIG. 3H, signals outputted from a part of the gate signal line driving circuit 301B_1, namely, 301Ba, are inputted to gate signal lines Gk−2 to Gk+2. The gate signal lines Gk−2 to Gk+2 can change their direction between the gate signal line driving circuit 301Ba and a part of the pixel region 303_4, namely, 303c. In this way, signals outputted from the gate signal line driving circuit 301B_1 are led to the left end of the pixel region 303 through the gate signal lines G(y/2+1) to G(3y/4) that are formed in parallel with one another between the pixel region 303 and the gate signal line driving circuit 301B_1. Once the gate signal lines G(y/2+1) to G(3y/4) are led to the left end of the pixel region 303, their direction is changed and signals are led through the left region of the pixel region 303 that overlaps the seal member 306 to the left side of the region 303_3 to be inputted to the region 303_3. FIG. 3I shows a part of the seal member 306, 306c, and a part of the region 303_3, 303c. As shown in FIG. 3J, signals are thus inputted to the gate signal lines Gi−2 to Gi+2 that are perpendicular to the source signal lines (represented by S in the drawing) in the pixel region 303_3.

Similarly, though not shown in the drawings, signals outputted from the gate signal line driving circuit 301B_2 are led between the gate signal line driving circuit 301B_2 and the pixel region 303_4 to the right end of the pixel region 303. Then the direction is changed and the signals are led through the right region of the pixel region 303 that overlaps the seal member 306 to the right end of the region 303_4 to be inputted to the region 303_4.

At this point, the gate signal line driving circuits 301A_1, 301A_2, 301B_1, and 301B_2 separately scan to output signals to the gate signal lines G1 to Gy sequentially. In this way signals are sequentially inputted to the gate signal lines G1 to Gy in the pixel region 303.

Since the above-described structure has no gate signal line driving circuit by the side of the pixel region, the frame area can be reduced further in the lateral direction of the pixel region. If the seal member is formed above the gate signal lines that are led through the left and right of the pixel region, the width of the left and right borders of the frame of the display device can be reduced even more.

When gate signal lines are led in four directions, namely, upper left, upper right, lower left, and lower right of a pixel region as in the above-described structure, y/4 gate signal lines at the most are arranged in parallel with one another to the left and right of the pixel region, respectively. If a gate signal line driving circuit is placed only above a pixel region and gate signal lines are led in one direction from upper left of the pixel region, y gate signal lines at the most are arranged in parallel with one another to the left of the pixel region.

By leading gate signal lines to a pixel region from several directions as in this embodiment mode, the number of wiring lines arranged in parallel to one another by the side of the pixel region can be reduced. This makes it possible to further reduce the frame area in the lateral direction of the pixel region.

Signal lines for inputting signals to the driving circuits (source signal line driving circuit 302 and gate signal line driving circuits 301) from the FPC substrate and power supply lines are formed on a layer different from the layer on which the gate signal lines led through the periphery of the pixel region 303 are formed.

Unlike Embodiment Mode 1, signals outputted from the gate signal line driving circuits have to be led to the left and right of the pixel region 303 in Embodiment Mode 2. Accordingly, the distance along which the gate signal lines G1 to Gy are led is long particularly in a display device that has a large pixel region. However, this embodiment mode does not need to place in the pixel region lead-out gate signal lines perpendicular to gate signal lines, and therefore can increase the aperture ratio in a transmissive display device. In addition, this embodiment mode does not require the lead-out gate signal lines to pierce through the source signal line driving circuit, and therefore has less limitation on the arrangement of the source signal line driving circuit.

Consequently, Embodiment Mode 2 is effective for a display device that has a rather small pixel region.

This embodiment mode can be applied freely to display devices of any structure as long as it has pixels driven by a driving circuit for selecting a pixel column (source signal line driving circuit) and a driving circuit for selecting a pixel row (gate signal line driving circuit). For example, this embodiment mode is applicable to liquid crystal display devices and OLED display devices.

Pixels of a display device according to this embodiment mode can be of any known structure as long as they are wired to signal lines for selecting a pixel column (source signal lines) and signal lines for selecting a pixel row (gate signal lines). Also, this embodiment mode can employ driving circuits of any known structure for the source signal line driving circuit and the gate signal line driving circuit.

For instance, the gate signal line driving circuit may be of the type that is composed of a shift register and other components to output signals sequentially, or the type that is composed of a decoder and other components to output signals sequentially in an arbitrary order.

Embodiment 1

Embodiment 1 shows an example of a liquid crystal display device structured as shown in FIG. 5B as the second structure of Embodiment Mode 1.

Figure 10:
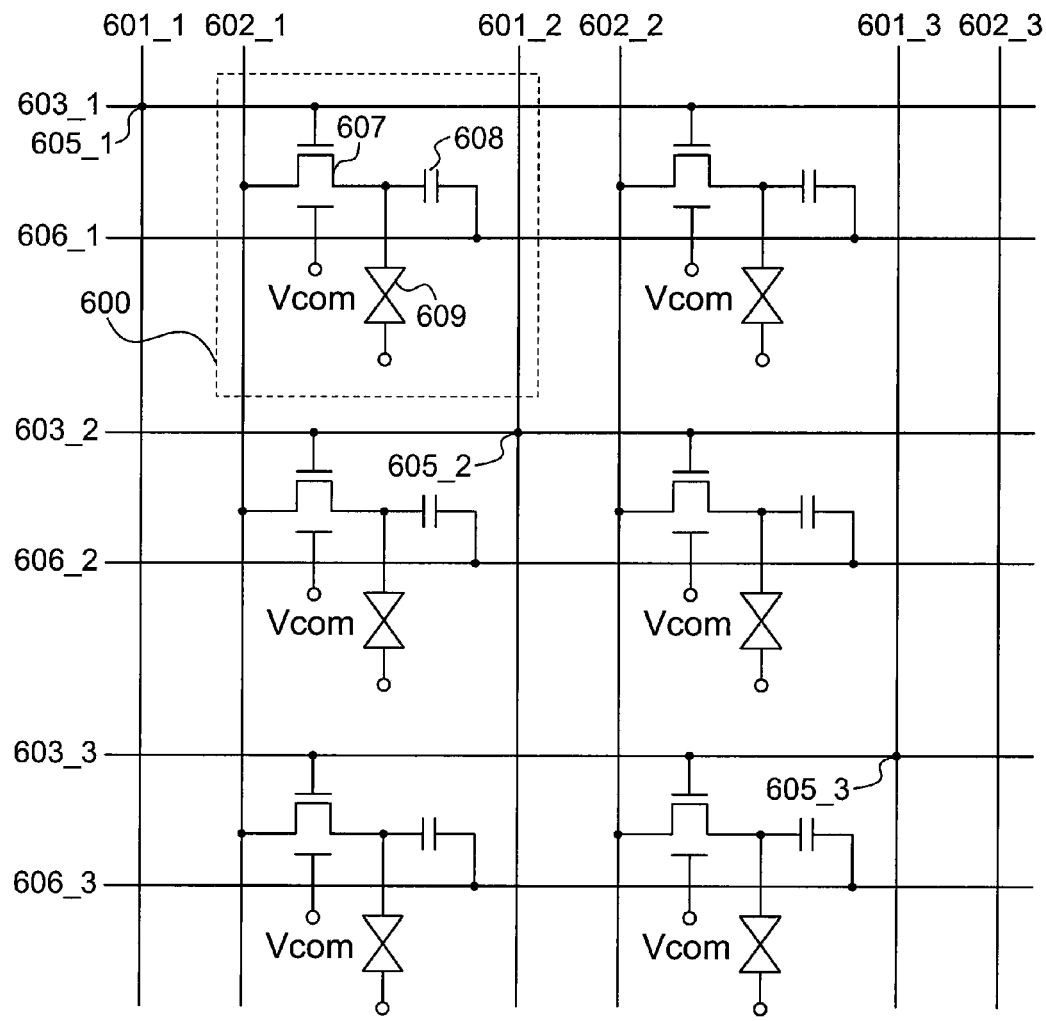
FIG. 10 is a circuit diagram showing the structure of a pixel of a liquid crystal display device according to Embodiment 1.

FIG. 10 is a circuit diagram showing the structure of a pixel according to this embodiment.

In FIG. 10, a source signal line 602_1, a gate signal line 603_1, a switching TFT 607, and a capacitor element (capacitor storage) 608 are arranged in one pixel 600.

Denoted by 603_1 to 603_3 are gate signal lines. 601_1 to 601_3 are lead-out gate signal lines. 606_1 to 606_3 are common lines.

In this embodiment, the switching TFT 607 is a dual-gate TFT that has a first gate electrode and a second gate electrode. One of the first and second gate electrodes of the switching TFT 607 receives an electric potential $V_{com}$ and the other is connected to the gate signal line 603_1.

The switching TFT 607 has a source region and a drain region one of which is connected to the source signal line 602_1 and the other of which is connected to one of electrodes of the capacitor storage 608 and to a liquid crystal element 609. The other electrode of the capacitor storage 608 is connected to the common line 606_1.

The gate signal line 603_1 is connected to the lead-out gate signal line 601_1 through a contact hole 605_1. Similarly, the gate signal line 603_2 is connected to the lead-out gate signal line 601_2 through a contact hole 605_2. The gate signal line 603_3 is connected to the lead-out gate signal line 601_3 through a contact hole 605_3.

FIGS. 6A to 6D are a top view and a sectional view of the pixel in the liquid crystal display device which is structured as shown in FIG. 10.

In FIGS. 6A to 6D, components that are identical with those in FIG. 10 are denoted by the same reference symbols and explanations thereof are omitted. Of the liquid crystal element, only the pixel electrode denoted by 609 is shown in FIGS. 6A to 6D and its opposing substrate, liquid crystal layer, alignment layer and the like are omitted.

Figure 6A:
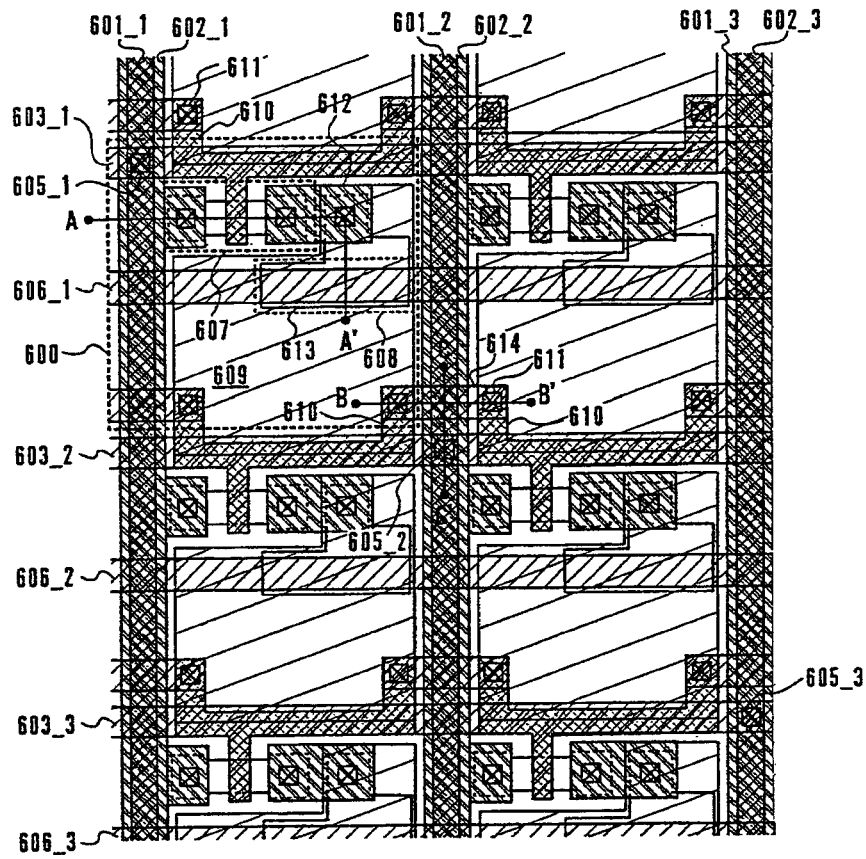
FIGS. 6A to 6D are diagrams showing the structure of a pixel of a liquid crystal display device according to Embodiment 1.
Figure 6B:
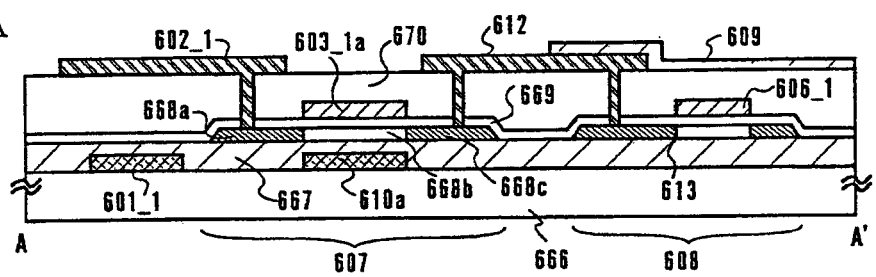
Figure 6C:
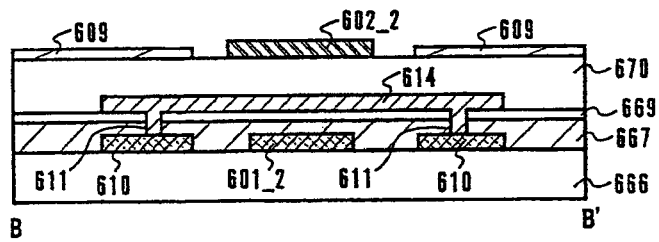
Figure 6D:
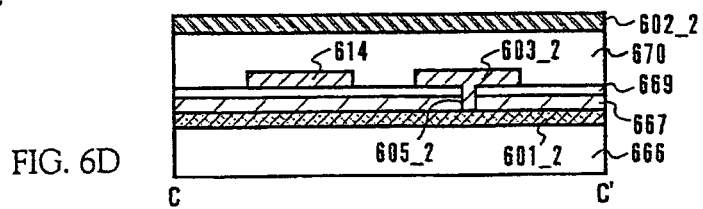

FIG. 6A is a top view of the liquid crystal display device. FIG. 6B is a sectional view taken along the line A-A' in FIG. 6A. FIG. 6C is a sectional view taken along the line B-B' in FIG. 6A. FIG. 6D is a sectional view taken along the line C-C' in FIG. 6A.

As shown in FIG. 6B, 668a that is one of the source region and drain region of the switching TFT 607 formed on a pixel substrate 666 is connected to a source signal line 602_1 whereas the other, 668c, is connected to one of the electrode of the capacitor storage 608 and the pixel electrode 609 through a wiring line 612. Here, the capacitor storage 608 is structured by an electrode 613 formed by the semiconductor layer and the common line 606_1 with an insulting film 669 sandwiched therebetween. Denoted by 670 is an interlayer film.

The switching TFT 607 is a dual-gate TFT having a first gate electrode 603_1a adjacent to a channel portion 668b with an insulating film 669 sandwiched there between and a second gate electrode 610a adjacent to a channel portion 668b with an insulating film 667 sandwiched therebetween. The first gate electrode 603_1a is a part of the gate signal line 603_1. The second gate electrode 610a is a part of a wiring line 610 that receives an electric potential V.

The lead-out gate signal line 601_1 is formed to overlap the power supply line 602_1.

As shown in FIG. 6C, a wiring line 610 for giving an electric potential $V_{com}$ to the second gate electrode 610a of the switching TFT 607 is connected to a wiring line 614 through a contact hole 611. The wiring line 610 is led above the lead-out gate signal line 601_2.

As shown in FIG. 6D, the lead-out gate signal line 601_2 is connected to the gate signal line 603_2 through a contact hole 605_2.

When the TFTs placed in each pixel are dual-gate TFTs as in the above-described structure, of the gate electrodes of each TFT which are formed on different layers, gate signal lines can be formed on a layer where one of the gate electrodes is formed whereas lead-out gate signal lines are formed on a layer where the other gate electrode is formed.

Embodiment 2

Embodiment 2 shows an example of the OLED display device structured as shown in FIG. 5C as the second structure of Embodiment Mode 1.

Figure 11:
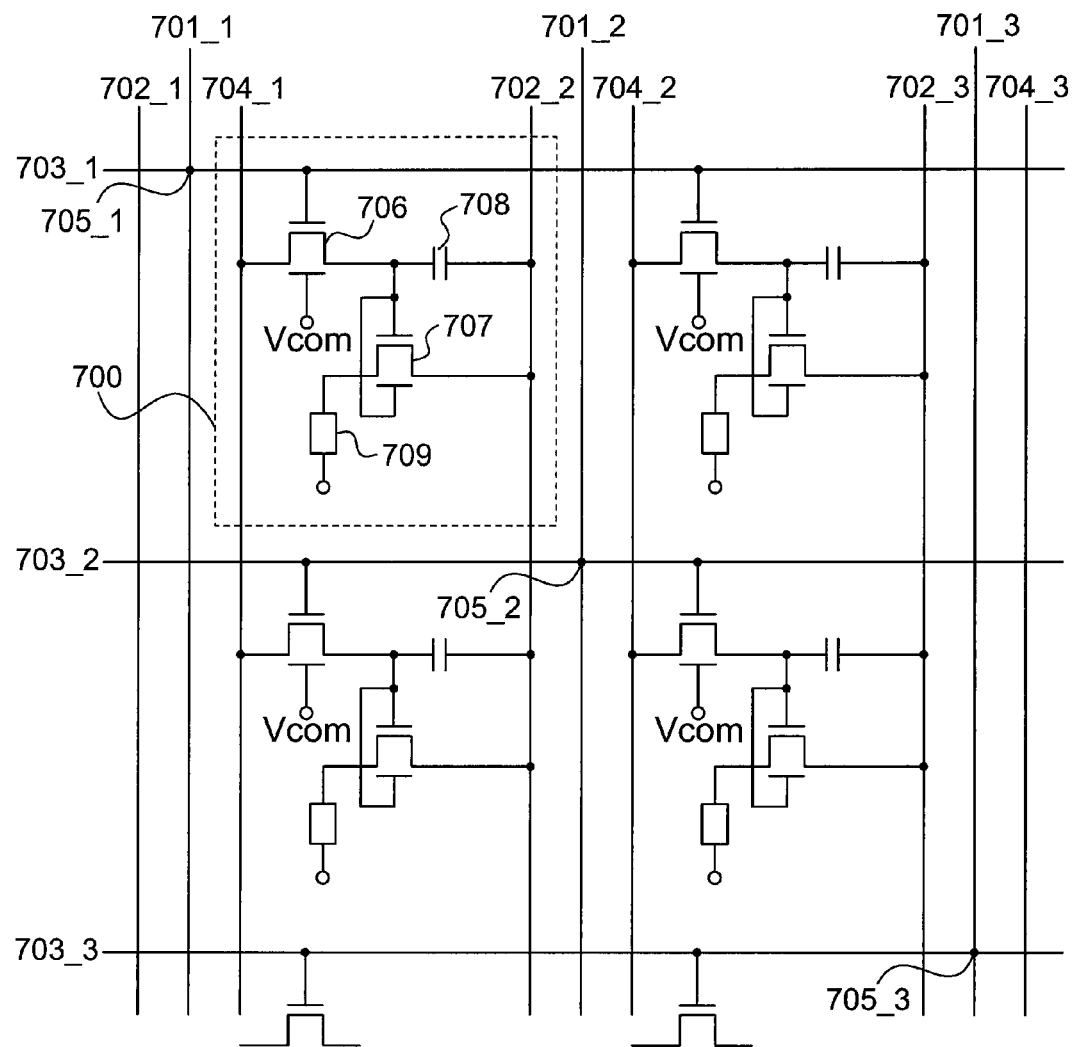
FIG. 11 is a circuit diagram showing the structure of a pixel of an OLED display device according to Embodiment 2.

FIG. 11 is a circuit diagram showing the structure of a pixel according to this embodiment.

In FIG. 11, a source signal line 704_1, a gate signal line 703_1, a power supply line 702_2, a switching TFT 706, a driving TFT 707, and a capacitor element (capacitor storage) 708 are arranged in one pixel 700.

Denoted by 703_1 to 703_3 are gate signal lines 701_1 to 701_3 are lead-out gate signal lines 704_1 to 704_3 are source signal lines 702_1 to 702_3 are power supply lines.

In this embodiment, the switching TFT 706 is a dual-gate TFT that has a first gate electrode and a second gate electrode. One of the first and second gate electrodes of the switching TFT 706 receives an electric potential $V_{com}$ and the other is connected to the gate signal line 703_1.

The driving TFT 707 is also a dual-gate TFT that has a first gate electrode and a second gate electrode. The first gate electrode of the driving TFT 707 and the second gate electrode thereof are connected to each other.

The dispersion of characteristic of TFT can be reduced by using dual gate TFT. For driving TFT 707, there is an especially necessity to reduce the dispersion of characteristic of TFT. Therefore, using the dual gate TFT 707 is an effective means.

The switching TFT 706 has a source region and a drain region one of which is connected to the source signal line 704_1 and the other of which is connected to one of electrodes of the capacitor storage 708 and to the gate electrodes (first gate electrode and second gate electrode) of the driving TFT 707. The other electrode of the capacitor storage 708 is connected to the power supply line 702_2. The driving TFT 707 has a source region and a drain region one of which is connected to the power supply line 702_2 and the other of which is connected to one of electrodes (pixel electrode) of an CLOD element 709.

The gate signal line 703_1 is connected to the lead-out gate signal line 701_1 through a contact hole 705_1. Similarly, the gate signal line 703_2 is connected to the lead-out gate signal line 701_2 through a contact hole 705_2. The gate signal line 703_3 is connected to the lead-out gate signal line 701_3 through a contact hole 705_3.

FIGS. 7A to 7E are a top view and a sectional view of the pixel in the OLED display device which is structured as shown in FIG. 11.

In FIGS. 7A to 7E, components that are identical with those in FIG. 11 are denoted by the same reference symbols and explanations thereof are omitted. Of the OLED element, only the pixel electrode denoted by 709 is shown in FIGS. 7A to 7E and its OLED layer, cover member, and the like are omitted.

Figure 7A:
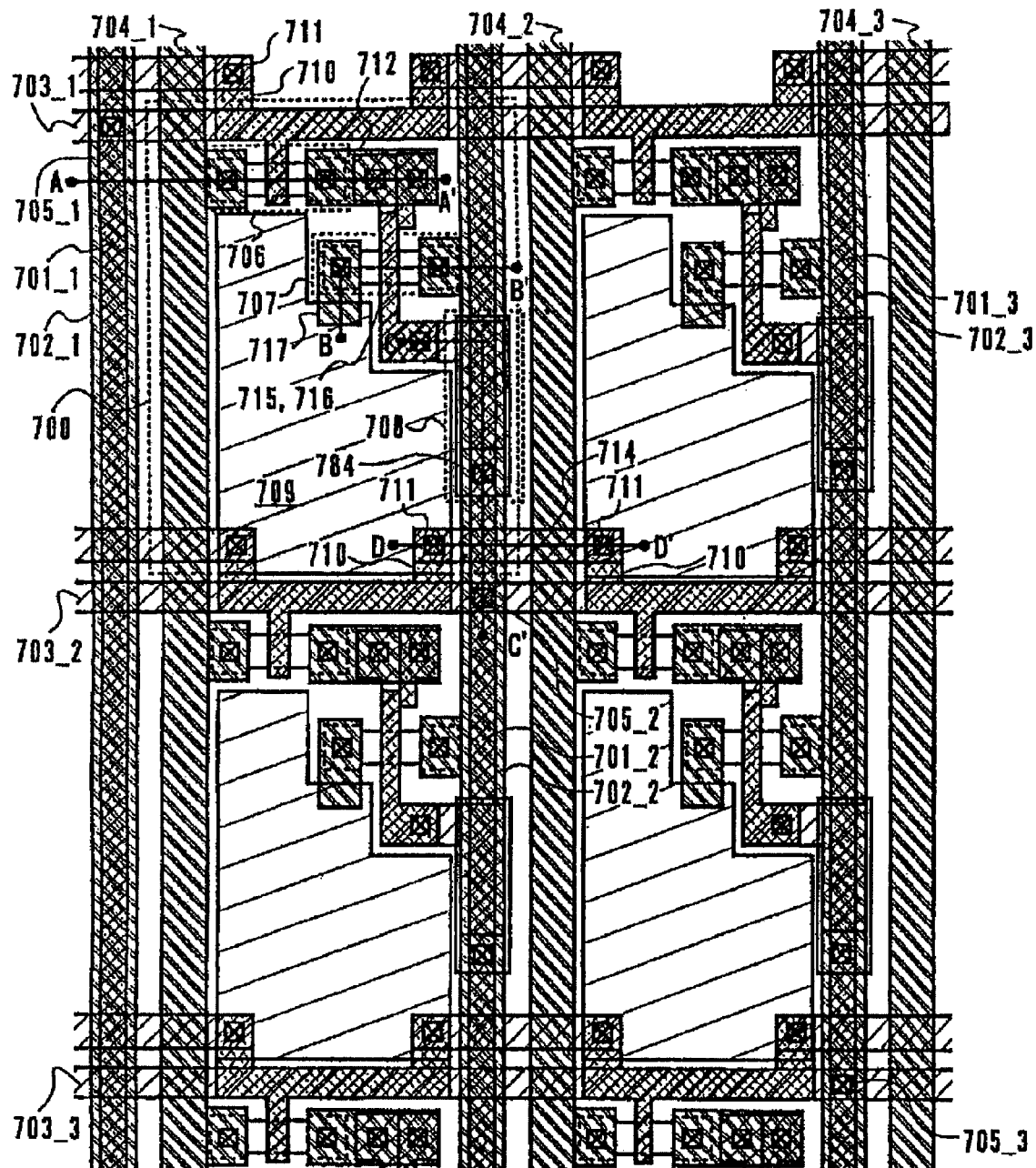
FIGS. 7A to 7E are diagrams showing the structure of a pixel of an OLED display device according to Embodiment 2.
Figure 7B:
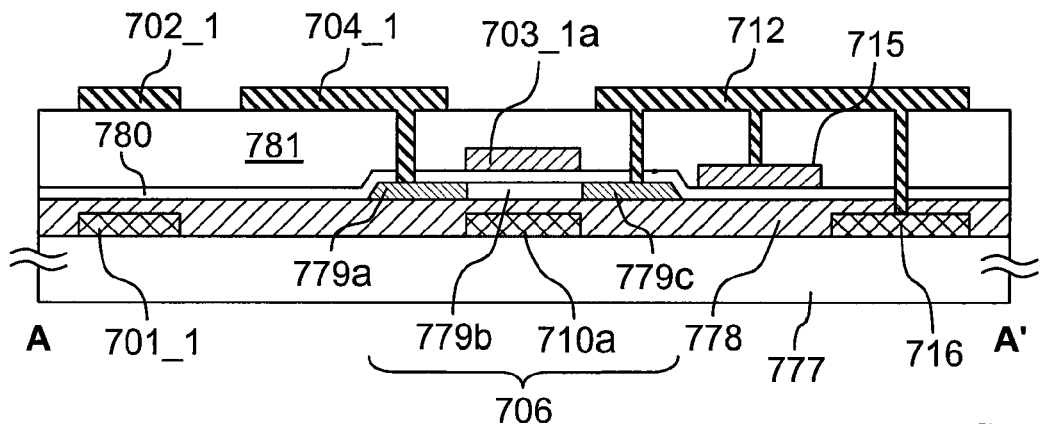
Figure 7C:
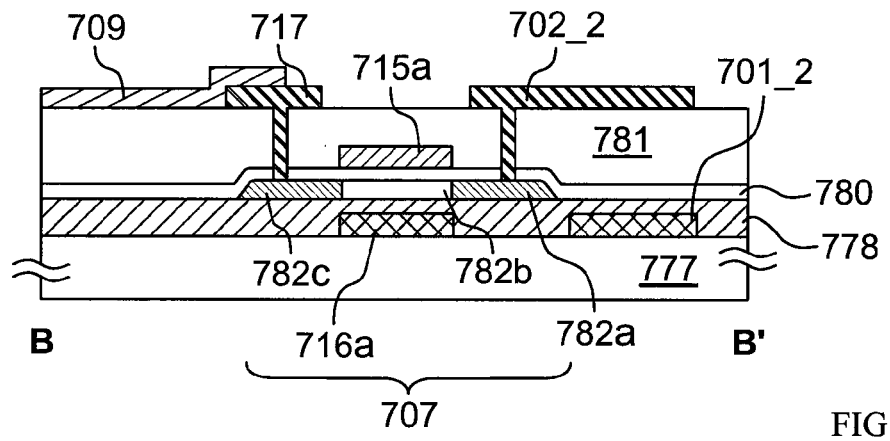
Figure 7D:
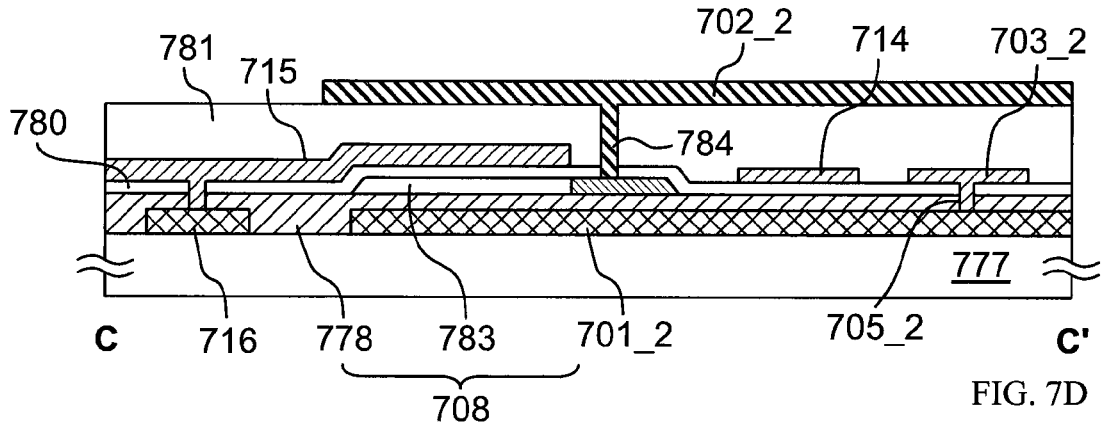
Figure 7E:
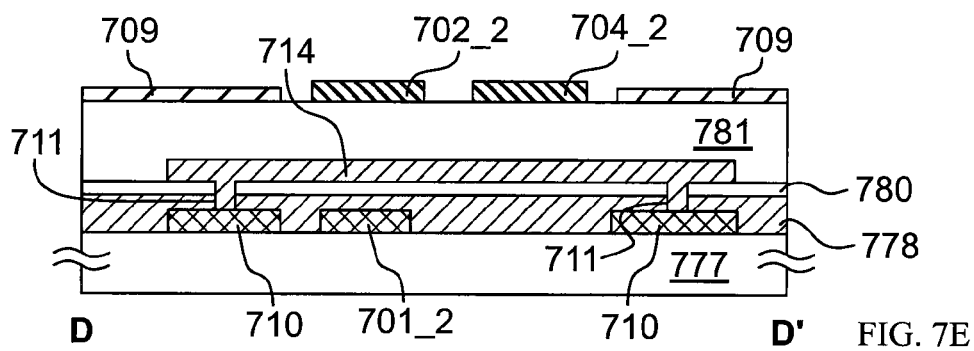

FIG. 7A is a top view of the OLED display device. FIG. 7B is a sectional view taken along the line A-A' in FIG. 7A. FIG. 7C is a sectional view taken along the line B-B' in FIG. 7A. FIG. 7D is a sectional view taken along the line C-C' in FIG. 7A. FIG. 7E is a sectional view taken along the line D-D' in FIG. 7A.

As shown in FIG. 7B, 779a that is one of the source region and drain region of the switching TFT 706 formed on a pixel substrate 777 is connected to a source signal line 704_1 whereas the other, 779c, is connected to wiring lines 715 and 716 through a wiring line 712. Denoted by 781 is an interlayer film.

The switching TFT 706 is a dual-gate TFT having a first gate electrode 703_1a adjacent to a channel portion 779b with an insulating film 780 sandwiched there between and a second gate electrode 710a adjacent to a channel portion 779b with an insulating film 778 sandwiched there between. The first gate electrode 703_1a is a part of the gate signal line 703_1. The second gate electrode 710a is apart of a wiring line 710 that receives an electric potential $V_{com}$.

The lead-out gate signal line 701_1 is formed to overlap the power supply line 702_1.

As shown in FIG. 7C, 782a that is one of the source region and drain region of the driving TFT 707 is connected to a pixel electrode 709 through a wiring line 717 whereas the other, 782c, is connected to a power supply line 702_2. In addition, the lead out gate signal line 701_2 is formed to overlap the power supply line 702_2.

The driving TFT 707 is a dual-gate TFT having a first gate electrode 715a adjacent to a channel portion 782b with an insulating film 780 sandwiched there between and a second gate electrode 716a adjacent to a channel portion 782b with an insulating film 778 sandwiched there between. The first gate electrode 715a is a part of the wiring line 715. The second gate electrode 716a is a part of a wiring line 716. Further, the wiring line 715 and the wiring line 716 are connected to each other (refer to FIG. 7D).

As shown in FIG. 7D, the wiring lines 715 and 716 are connected each other. The wiring line 715 serves as one of the electrodes of the capacitor storage 708. The other electrode of the capacitor storage is 783 that is formed of a semiconductor layer 783 is connected to the power supply line 702_2 through a contact hole 784.

The lead-out gate signal line 701_2 is connected to the gate signal line 703_2 through a contact hole 705_2.

As shown in FIG. 7E, a wiring line 710 for giving an electric potential $V_{com}$ to the second gate electrode 710a of the switching TFT 706 is connected to a wiring line 714 through a contact hole 711. The wiring line 710 is led above the lead-out gate signal line 701_2.

When the TFTs placed in each pixel are dual-gate TFTs as in the above-described structure, of the gate electrodes of each TFT which are formed on different layers, gate signal lines can be formed on a layer where one of the gate electrodes is formed whereas lead-out gate signal lines are formed on a layer where the other gate electrode is formed.

Embodiment 3

An example of the second structure has been given in Embodiment 2. This embodiment shows another example of the OLED display device structured as shown in FIG. 5C as the second structure of Embodiment Mode 1.

Figure 12:
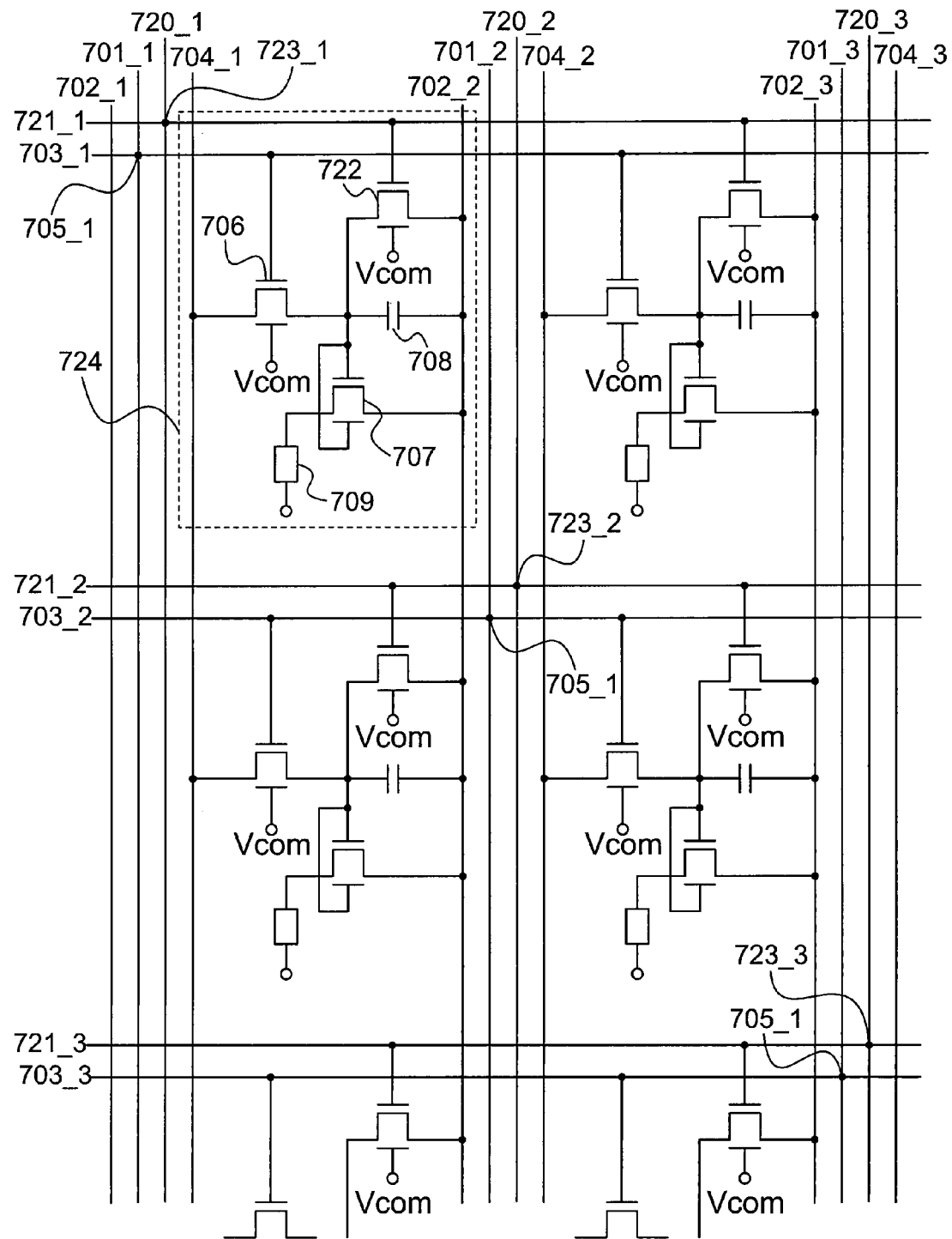
FIG. 12 is a circuit diagram showing the structure of a pixel of an OLED display device according to Embodiment 3.

FIG. 12 is a circuit diagram showing the structure of a pixel according to this embodiment. In FIG. 12, components that are identical with those in FIG. 11 are denoted by the same reference symbols.

In FIG. 12, a source signal line 704_1, a gate signal line 703_1, a power supply line 702_2, a switching TFT 706, a driving TFT 707, an erasing TEE 722, and a capacitor element (capacitor storage) 708 are arranged in one pixel 724.

Denoted by 703_1 to 703_3 are gate signal lines 701_1 to 701_3 are lead-out gate signal lines 721_1 to 721_3 are erasing gate signal lines 720_1 to 720_3 are lead-out erasing gate signal lines 704_1 to 704_3 are source signal lines 702_1 to 702_3 are power supply lines.

In this embodiment, the switching TFT 706 is a dual-gate TFT that has a first gate electrode and a second gate electrode. One of the first and second gate electrodes of the switching TFT 706 receives an electric potential $V_{com}$ and the other is connected to the gate signal line 703_1.

The driving TFT 707 is also a dual-gate TFT that has a first gate electrode and a second gate electrode. The first gate electrode of the driving TFT 707 and the second gate electrode thereof are connected to each other.

Erasing TFT 722 too is a dual-gate TFT that has a first gate electrode and a second gate electrode. One of the first and second gate electrodes of the erasing TFT 722 receives an electric potential $V_{com}$ and the other is connected to the erasing gate signal line 721_1.

The switching TFT 706 has a source region and a drain region one of which is connected to the source signal line 704_1 and the other of which is connected to one of electrodes of the capacitor storage 708 and to the gate electrodes (first gate electrode and second gate electrode) of the driving TFT 707. The other electrode of the capacitor storage 708 is connected to the power supply line 702_2. The driving TFT 707 has a source region and a drain region one of which is connected to the power supply line 702_2 and the other of which is connected to one of electrodes (pixel electrode) of an OLED element 709.

The erasing TFT 722 has a source region and a drain region one of which is connected to the power supply line 702_2 and the other of which is connected to the gate electrodes (first gate electrode and second gate electrode) of the driving TFT 707.

The gate signal line 703_1 is connected to the lead-out gate signal line 701_1 through a contact hole 705_1. Similarly, the gate signal line 703_2 is connected to the lead-out gate signal line 701_2 through a contact hole 705_2. The gate signal line 703_3 is connected to the lead-out gate signal line 701_3 through a contact hole 705_3.

The erasing gate signal line 721_1 is connected to the lead-out erasing gate signal line 720_1 through a contact hole 723_1. Similarly, the erasing gate signal line 721_2 is connected to the lead-out erasing gate signal line 720_2 through a contact hole 723_2. The erasing gate signal line 721_3 is connected to the lead-out erasing gate signal line 720_3 through a contact hole 723_3.

FIGS. 8A to 8E are a top view and sectional views of the pixel in the OLED display device which is structured as shown in FIG. 12.

In FIGS. 8A to 8E, components that are identical with those in FIG. 12 are denoted by the same reference symbols and explanations thereof are omitted. Of the OLED element, only the pixel electrode denoted by 709 is shown in FIGS. 8A to 8E and its OLED layer, cover member, and the like are omitted.

Figure 8A:
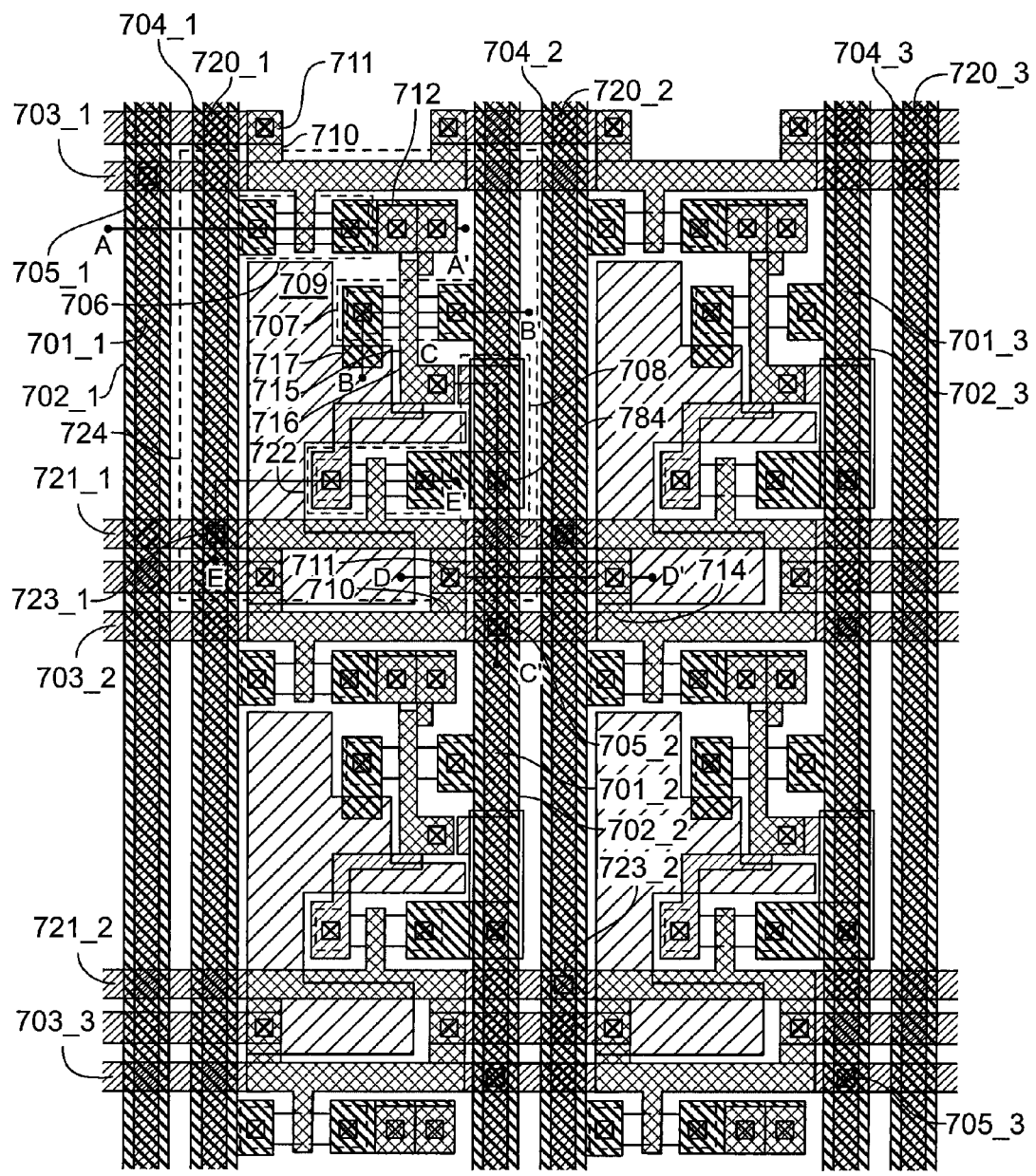
FIGS. 8A to 8E are diagrams showing the structure of a pixel of an OLED display device according to Embodiment 3.
Figure 8B:
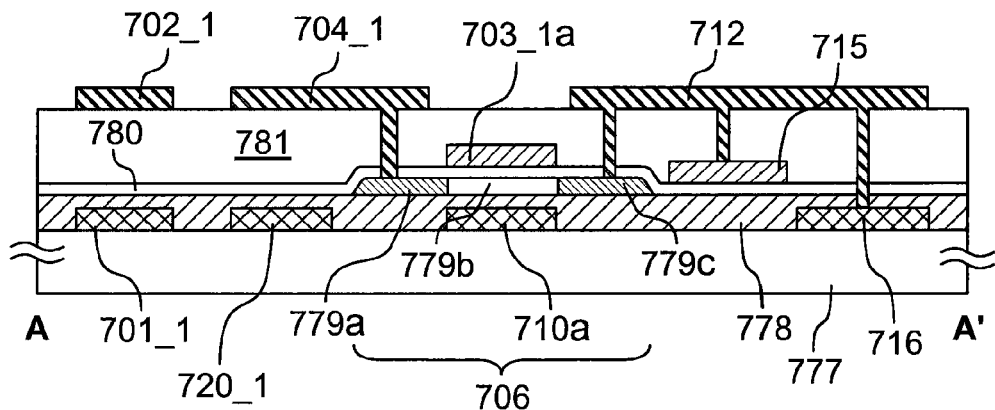
Figure 8C:
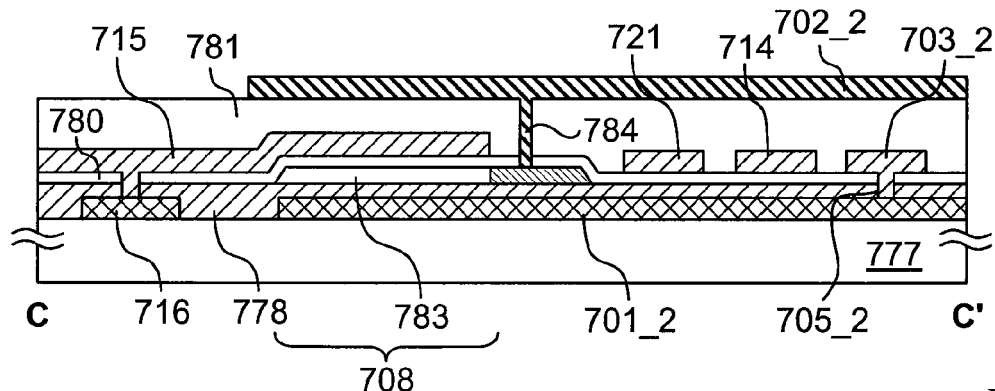
Figure 8D:
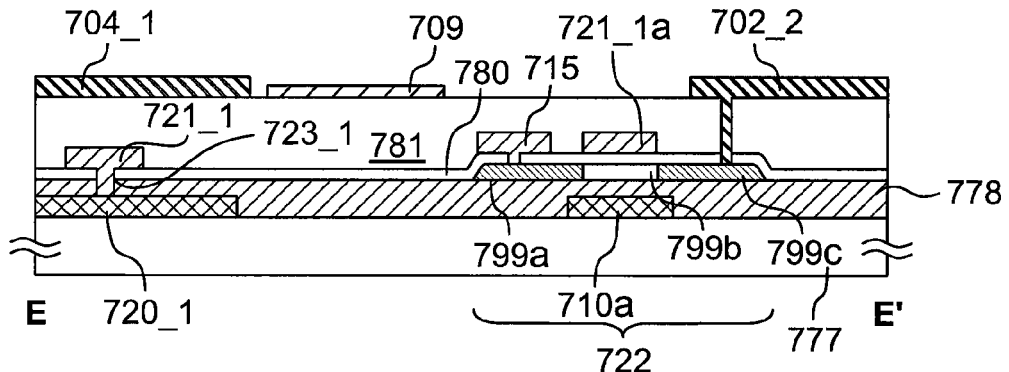
Figure 8E:
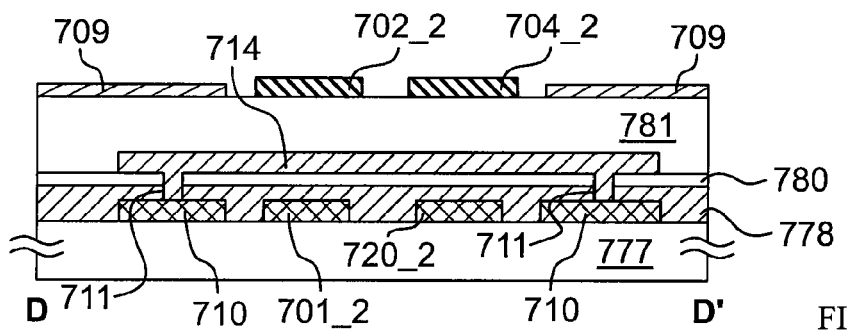
Figure 9:
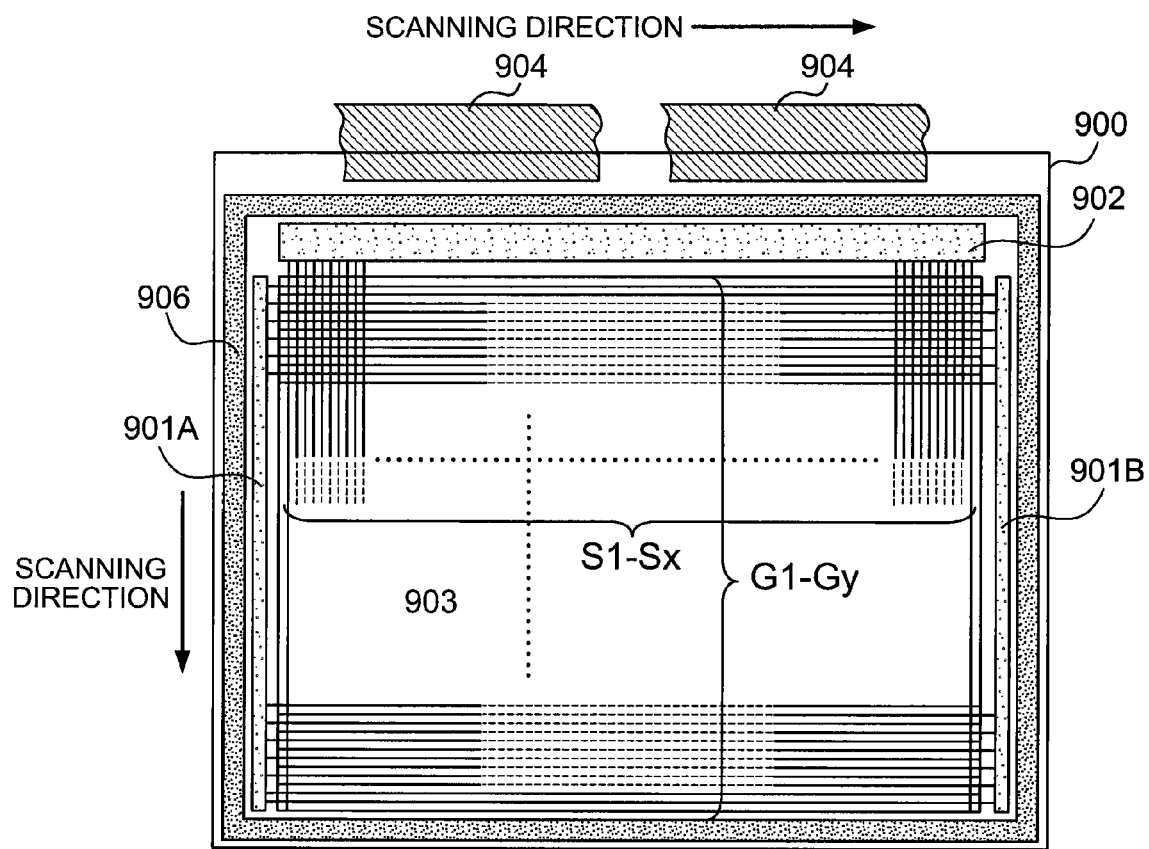
FIG. 9 is a diagram showing a structure of a conventional display device.

FIG. 8A is a top view of the OLED display device. FIG. 8B is a sectional view taken along the line A-A' in FIG. 8A. FIG. 8C is a sectional view taken along the line C-C' in FIG. 8A. FIG. 8D is a sectional view taken along the line E-E' in FIG. 8A. FIG. 8E is a sectional view taken along the line D-D' in FIG. 8A. A sectional view taken along the line B-B' in FIG. 8A is identical with FIG. 7C.

As shown in FIG. 8B, 779a that is one of the source region and drain region of the switching TFT 706 formed on a pixel substrate 777 is connected to a source signal line 704_1 whereas the other, 779c, is connected to wiring lines 715 and 716 through a wiring line 712. Denoted by 781 is an interlayer film.

The switching TFT 706 is a dual-gate TFT having a first gate electrode 703_1a adjacent to a channel portion 779b with an insulating film 780 sandwiched therebetween and a second gate electrode 710a adjacent to a channel portion 779b with an insulating film 778 sandwiched therebetween. The first gate electrode 703_1a is a part of the gate signal line 703_1. The second gate electrode 710a is a part of a wiring line 710 that receives an electric potential $V_{com}$.

The lead-out gate signal line 701_1 is formed to overlap the power supply line 702_1. Also, the lead-out erasing gate signal line 720_1 is formed to overlap the source signal line 704_1.

As shown in FIG. 7C, the wiring lines 715 and 716 are connected. The wiring line 715 serves as one of the electrodes of the capacitor storage 708. The other electrode of the capacitor storage is 783 that is formed of a semiconductor layer. 783 is connected to the power supply line 702_2 through a contact hole 784.

The lead-out gate signal line 701_2 is connected to the gate signal line 703_2 through a contact hole 705_2.

As shown in FIG. 8D, 799a that is one of the source region and drain region of the erasing TFT 722 is connected to the wiring line 715 whereas the other, 799c, is connected to the power supply line 702_2.

The erasing TFT 722 is a dual-gate TFT having a first gate electrode 721_1a adjacent to a channel portion 799b with an insulating film 780 sandwiched therebetween and a second gate electrode 710a adjacent to a channel portion 799b with an insulating film 778 sandwiched therebetween. The first gate electrode 721_1a is a part of the erasing gate signal line 721_1. The second gate electrode 710a is a part of a wiring line 710 that receives an electric potential $V_{com}$.

The lead-out erasing gate signal line 720_1 is formed to overlap a source signal line 704_1. The lead-out gate signal line 720_1 is connected to the erasing gate signal line 721_1 through a contact hole 723_1.

As shown in FIG. 7E, the wiring line 710 for giving an electric potential $V_{com}$ to the second gate electrode of the switching TFT 706 and to the second gate electrode 710a of the erasing TFT 722 is connected to a wiring line 714 through a contact hole 711. The wiring line 710 is led above the lead-out gate signal line 701_2 and the lead-out erasing gate signal line 720_1.

When the TFTs placed in each pixel are dual-gate TFTs as in the above-described structure, of the gate electrodes of each TFT which are formed on different layers, gate signal lines and erasing gate signal lines can be formed on a layer where one of the gate electrodes is formed whereas lead-out gate signal lines and lead-out erasing gate signal lines are formed on a Layer where the other gate electrode is formed.

Embodiment 4

An example of the display device of Embodiment Mode 2 has been shown in FIGS. 3A to 3J. This embodiment gives another specific example of the display device structured as shown in FIG. 4 in Embodiment Mode 2.

FIGS. 13A to 13F show the structure of a display device according to this embodiment. Components in FIGS. 13A to 13F that are identical with those of Embodiment Mode 2 shown in FIGS. 3A to 3J are denoted by the same reference symbols.

FIG. 13A is a top view of the display device. Gate signal line driving circuits 1301 (1301A and 1301B), a source signal line driving circuit 302, a pixel region 303, an FPC substrate 304, and a seal member 306 are arranged on a pixel substrate 300.

Output signals of the gate signal line driving circuits 1301A and 1301B are led through the periphery of the source signal line driving circuit 302 and the periphery of the pixel region 303 and inputted to the pixel region 303.

A specific example of leading gate signal lines for inputting to the pixel region 303 output signals of the gate signal line driving circuits 1301A and 1301B will be described in detail with reference to FIGS. 13B to 13F.

The number of gate signal lines placed in the pixel region is represented by y (y is a natural number). Here, y is a multiple of 4 for the sake of explanation, but the present invention is not limited thereto.

The gate signal line driving circuit 1301A is divided into two blocks, 1301A_1 and 1301A_2. The gate signal line driving circuit 1301B is divided into two blocks, 1301B_1 and 1301B_2.

The gate signal line driving circuit 1301A_1 is a circuit for inputting signals to even-numbered gate signal lines out of the first to (y/2)-th gate signal lines G1 to G(y/2) placed in the pixel region 303. The gate signal line driving circuit 1301A_2 is a circuit for inputting signals to odd-numbered gate signal lines out of the first to (y/2)-th gate signal lines G1 to G(y/2) placed in the pixel region 303. An area of the pixel region 303 where the gate signal lines G1 to G(y/2) for receiving signals outputted from the gate signal line driving circuits 1301A_1 and 1301A_2 are placed is denoted by 303_A.

Similarly, the gate signal line driving circuit 1301B_1 is a circuit for inputting signals to even-numbered gate signal lines out of the (y/2+1)-th to y-th gate signal lines G(y/2+1) to Gy placed in the pixel region 303. The gate signal line driving circuit 1301B_2 is a circuit for inputting signals to odd-numbered gate signal lines out of the (y/2+1)-th to y-th gate signal lines G(y/2+1) to Gy placed in the pixel region 303. An area of the pixel region 303 where the gate signal lines G(y/2+1) to Gy for receiving signals outputted from the gate signal line driving circuits 1301B_1 and 1301B_2 are placed is denoted by 303_B.

First, a detailed description is given about wiring lines for inputting output signals of the gate signal line driving circuit 1301A_1 to the region 303_A. FIGS. 13B and 13C respectively show detailed structures of regions denoted by 1311a and 1312a in FIG. 13A.

As shown in FIG. 13B, signals outputted from a part of the gate signal line driving circuit 1301A_1, namely, 1301Aa, are inputted to the gate signal lines Gi−4, Gi−2, Gi, Gi+2, and Gi+4. The gate signal lines Gi−4, Gi−2, Gi, Gi+2, and Gi+4 can change their direction between the gate signal line driving circuit 1301Aa and a part of the source signal line driving circuit 302, namely, 302a. In this way, signals outputted from the gate signal line driving circuit 1301A_1 are led to the left end of the source signal line driving circuit 302 through, odd-numbered gate signal lines out of the gate signal lines G1 to G(y/2) that are formed in parallel to one another between the source signal line driving circuit 302 and the gate signal line driving circuit 1301A_1. Once the gate signal lines are led to the left end of the source signal line driving circuit 302, their direction is changed and the signals are led through the left region of the pixel region 303 that overlaps the seal member 306 to the left side of the region 303_A to be inputted to the region 303_A. FIG. 13C shows a part of the seal member 306, 306a, and a part of the region 303_A, 303a.

Next, a detailed description is given about wiring lines for inputting output signals of the gate signal line driving circuit 1301A_2 to the region 303_A. FIGS. 13D and 13E respectively show detailed structures of regions denoted by 1311b and 1312b in FIG. 13A.

As shown in FIG. 13D, signals outputted from a part of the gate signal line driving circuit 1301A_2, namely, 1301Ab, are inputted to the gate signal lines Gi−5, Gi−3, Gi−1, Gi+1, and Gi+3. The gate signal lines Gi−5, Gi−3, Gi−1, Gi+1, and Gi+3 can change their direction between the gate signal line driving circuit 1301Ab and a part of the source signal line driving circuit 302, namely, 302b.

In this way, signals outputted from the gate signal line driving circuit 1301A_2 are led to the right end of the source signal line driving circuit 302 through odd-numbered gate signal lines out of the gate signal lines G1 to G(y/2) that are formed in parallel to one another between the source signal line driving circuit 302 and the gate signal line driving circuit 1301A_2. Once the gate signal lines are led to the right end of the source signal line driving circuit 302, their direction is changed and the signals are led through the right region of the pixel region 303 that overlaps the seal member 306 to the right side of the region 303_A to be inputted to the region 303_A. FIG. 13E shows a part of the seal member 306, 306b, and a part of the region 303_A, 303b.

As shown in FIG. 13F, the above-described structure inputs signals to the gate signal lines Gi−5 to G+4 that are perpendicular to the source signal lines (represented by S in the drawing) in a part of the pixel region 303_A, namely, 1313ab.

Similarly, gate signal lines are led also from the gate signal line driving circuits 1301B_1 and 1301B_2 to be connected to the gate signal lines of the pixel region 303B.

In this way, signals from the gate signal line driving circuit 1301A and 1301B are inputted to the gate signal lines G1 to Gy of the pixel region 303.

Signal lines for inputting signals to the driving circuits (source signal line driving circuit 302 and gate signal line driving circuits 1301) from the FPC substrate and power supply lines are formed on a layer different from the layer on which the gate signal lines led through the periphery of the pixel region 303 are formed.

This embodiment can be applied freely to display devices of any structure as long as it has pixels driven by a driving circuit for selecting a pixel column (source signal line driving circuit) and a driving circuit for selecting a pixel row (gate signal line driving circuit). For example, this embodiment is applicable to liquid crystal display devices and OLED display devices.

Pixels of a display device according to this embodiment can be of any known structure as long as they are wired to signal lines for selecting a pixel column (source signal lines) and signal lines for selecting a pixel row (gate signal lines). Also, this embodiment can employ driving circuits of any known structure for the source signal line driving circuit and the gate signal line driving circuit.

For instance, the gate signal line driving circuit may be of the type that is composed of a shift register and other components to output signals sequentially, or the type that is composed of a decoder and other components to output signals sequentially in an arbitrary order.

Embodiment 5

This embodiment shows an example of applying a display device of the present invention to an OLED display device.

Figure 16A:
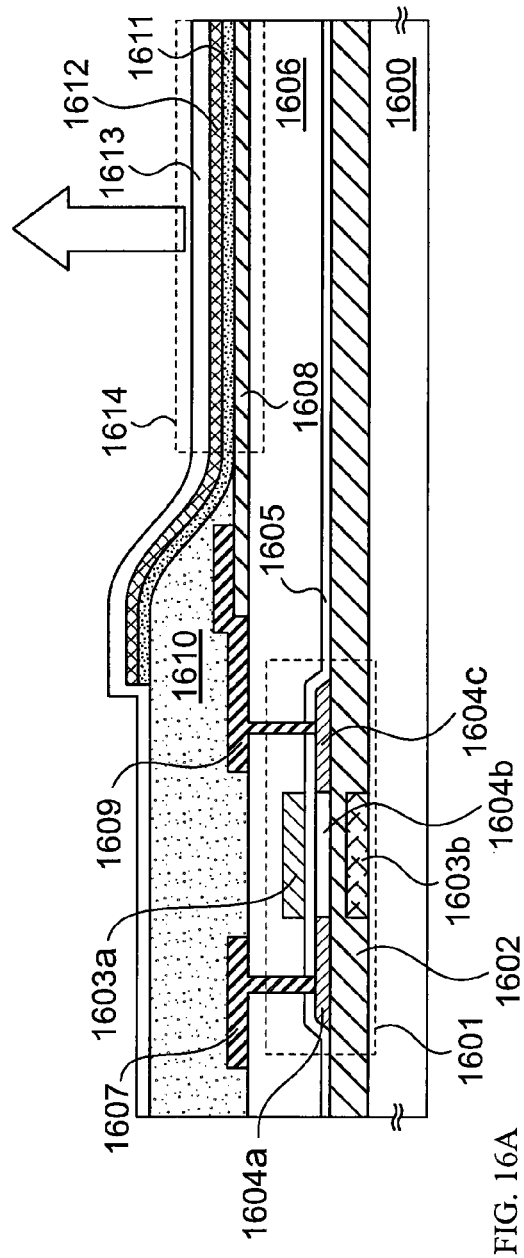
FIGS. 16A and 16B are sectional views each showing the structure of a pixel of an OLED display device according to the Embodiment 5.
Figure 16B:
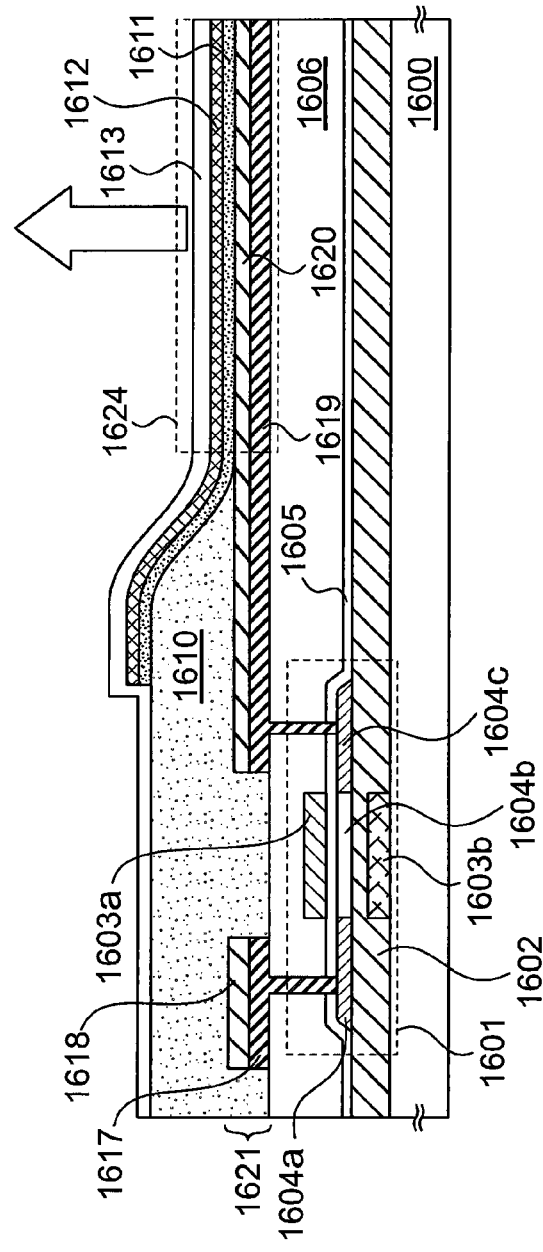

FIGS. 16A and 16B are sectional views each showing the structure of an OLED display device according to the present invention. In this embodiment, an OLED element and a driving TFT for flowing a drain current to the OLED element alone are shown as components that constitute a pixel of the OLED display device.

In this specification, an OLED element refers to an element with an anode and a cathode sandwiching an OLED layer that emits light by an electro luminescence effect upon generation of electric field.

The term OLED element in this specification includes both an OLED element that utilizes light emission accompanying transition from singlet excitation to the base state (fluorescent light) and an OLED element that utilizes light emission accompanying transition from triplet excitation to the base state (phosphorescent light).

An OLED layer is made up of a hole injection layer, a hole transporting layer, a light emitting layer, an electron transporting layer, an electron injection layer, and the like. The basic structure of the OLED element is a laminate of an anode, a light emitting layer, and a cathode layered in this order. The basic structure may be modified into a structure consisting of an anode, a hole injection layer, a light emitting layer, an electron injection layer, and a cathode which are layered in this order, or a structure consisting of an anode, a hole injection layer, a hole transporting layer, a light emitting layer, an electron transporting layer, an electron injection layer, and a cathode which are layered in this order.

In FIG. 16A, a driving TFT 1601 is formed on a pixel substrate 1600. The driving TFT 1601 is a dual-gate TFT that has a first gate electrode 1603a, a second gate electrode 1603b, and a channel formation region 1604b. The channel formation region 1604b is sandwiched between insulating films 1602 and 1605, which are in turn sandwiched between the first and second gate electrodes. The driving TFT 1601 has a source region and a drain region, one of which is denoted by 1604a and the other of which is denoted by 1604c. After the driving TFT 1601 is formed, an interlayer film 1606 is formed.

The structure of the driving TFT 1601 is not limited to the one shown in the drawing. A TFT of any known structure can be employed as the driving TFT 1601.

Formed next is a transparent conductive film, typically an ITO film, which is then patterned into a desired shape to obtain a pixel electrode 1608. The pixel electrode 1608 here serves as an anode. Contact holes reaching the source region and drain region, namely 1604a and 1604c, of the driving TFT are formed in the interlayer film 1606. A laminate consisting of a Ti layer, an Al layer that contains Ti, and another Ti layer is formed and patterned into a desired shape to obtain wiring lines 1607 and 1609. The TFT is made conductive by contacting the wiring line 1609 to the pixel electrode 1608.

Then an insulating film is formed from an organic resin material such as acrylic. An opening is formed in the insulating film at a position that coincides with the position of the pixel electrode 1608 of an OLED element 1614 to obtain an insulating film 1610. The opening has to be formed to have side walls tapered gently enough to avoid degradation or discontinuation of the OLED layer due to the level difference in side walls of the opening.

An OLED layer 1611 is formed next. Thereafter, an opposite electrode (cathode) 1612 of the OLED element 1614 is formed from a laminate consisting of a cesium (Cs) film 2 nm or less in thickness and a silver (Ag) film 10 nm or less in thickness which are layered in order. If the opposite electrode 1612 of the OLED element 1614 is very thin, light generated in the OLED layer 1611 is transmitted through the opposite electrode 1612 and emitted in the direction opposite to the pixel substrate 1600. Next, a protective film 1613 is formed in order to protect the OLED element 1614.

In the display device that emits light in the direction opposite to the pixel substrate 1600, light emission of the OLED element 1614 does not need to travel through the components formed on the pixel substrate 1600 side, including the driving TFT 1601, to be viewed. Therefore this type of display devices can have a large aperture ratio.

The pixel electrode 1608 may serve as a cathode while the opposite electrode 1612 serves as an anode if TiN or the like is used to form the pixel electrode and a transparent conductive film such as an ITO film is used for the opposite electrode. Then light generated in the OLED layer 1611 can be emitted in the direction opposite to the pixel substrate 1600 from the anode side.

FIG. 16B is a sectional view showing the structure of a pixel that has an OLED element structured differently from FIG. 16A.

Components in FIG. 16B that are identical with those in FIG. 16A are denoted by the same reference symbols in the explanation.

The pixel of FIG. 16B is formed by a process identical with the process for the pixel of FIG. 16A up through formation of the driving TFT 1601 and interlayer film 1606.

Next, contact holes reaching the source region and drain region, 1604a and 1604c, of the driving TFT are formed in the interlayer film 1606. Thereafter, a laminate consisting of a Ti layer, an Al layer that contains Ti, and another Ti layer is formed and a transparent conductive film, typically an ITO film, is formed in succession. The laminate consisting of a Ti layer, an Al layer that contains Ti, and another Ti layer and the transparent conductive film, typically an ITO film, are patterned into desired shapes to obtain wiring lines 1621 and 1619 and a pixel electrode 1620. The wiring line 1621 is composed of 1617 and 1618. The pixel electrode 1620 serves as an anode of an OLED element 1624.

Then an insulating film is formed from an organic resin material such as acrylic. An opening is formed in the insulating film at a position that coincides with the position of the pixel electrode 1620 of the OLED element 1624 to obtain the insulating film 1610. The opening has to be formed to have side walls tapered gently enough to avoid degradation or discontinuation of the OLED layer due to the level difference in side walls of the opening.

The OLED layer 1611 is formed next. Thereafter, an opposite electrode (cathode) 1612 of the OLED element 1624 is formed from a laminate consisting of a cesium (Cs) film 2 nm or less in thickness and a silver (Ag) film 10 nm or less in thickness which are layered in order. If the opposite electrode 1612 of the OLED element 1624 is very thin, light generated in the OLED layer 1611 is transmitted through the opposite electrode 1612 and emitted in the direction opposite to the pixel substrate 1600. Next, the protective film 1613 is formed in order to protect the OLED element 1624.

In the display device that emits light in the direction opposite to the pixel substrate 1600, light emission of the OLED element 1624 does not need to travel through the components formed on the pixel substrate 1600 side, including the driving TFT 1601, to be viewed. Therefore this type of display devices can have a large aperture ratio.

The pixel electrode 1620 and the wiring line 1621 may serve as a cathode while the opposite electrode 1612 serves as an anode if TiN or the like is used to form the pixel electrode and a transparent conductive film such as an ITO film is used for the opposite electrode. Then light generated in the OLED layer 1611 can be emitted in the direction opposite to the pixel substrate 1600 from the anode side.

Compared to the pixel structured as shown in FIG. 16A, the pixel structured as shown in FIG. 16B can reduce the number of photo masks required in the manufacturing process and can simplify the process because the wiring line 1619, which is connected to the source region or drain region of the driving TFT, and the pixel electrode 1620 can be patterned by using the same photo mask.

This embodiment may be combined freely with Embodiments 1 through 4.

Embodiment 6

The display device of the present invention can be used to electronic apparatuses.

Figure 14B:
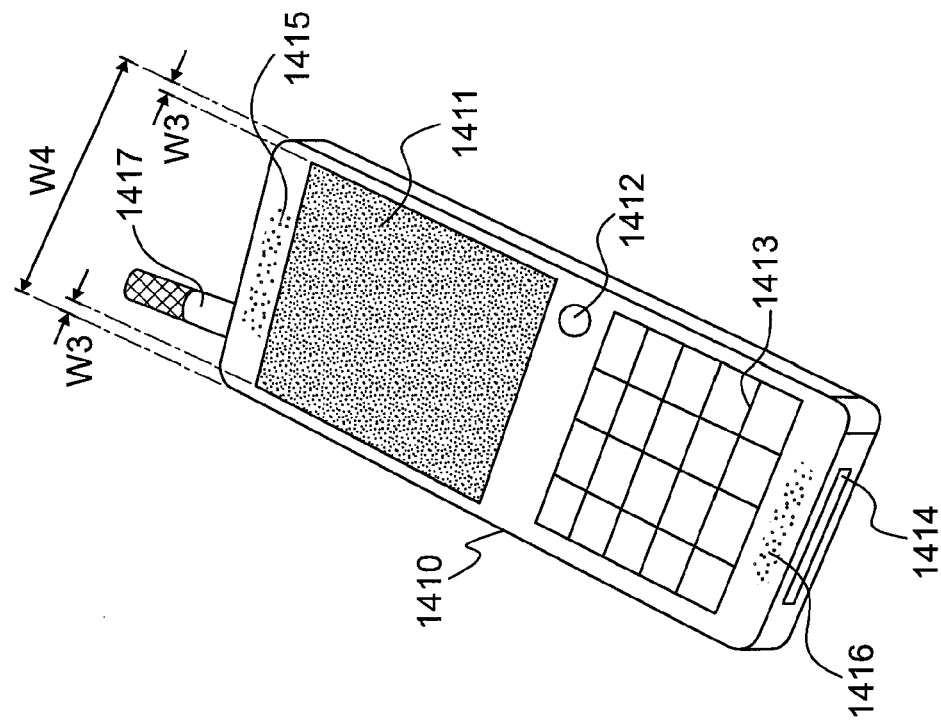
FIGS. 14A and 14B are diagrams showing electronic equipment using a display device of the present invention in Embodiment 6.
Figure 14A:
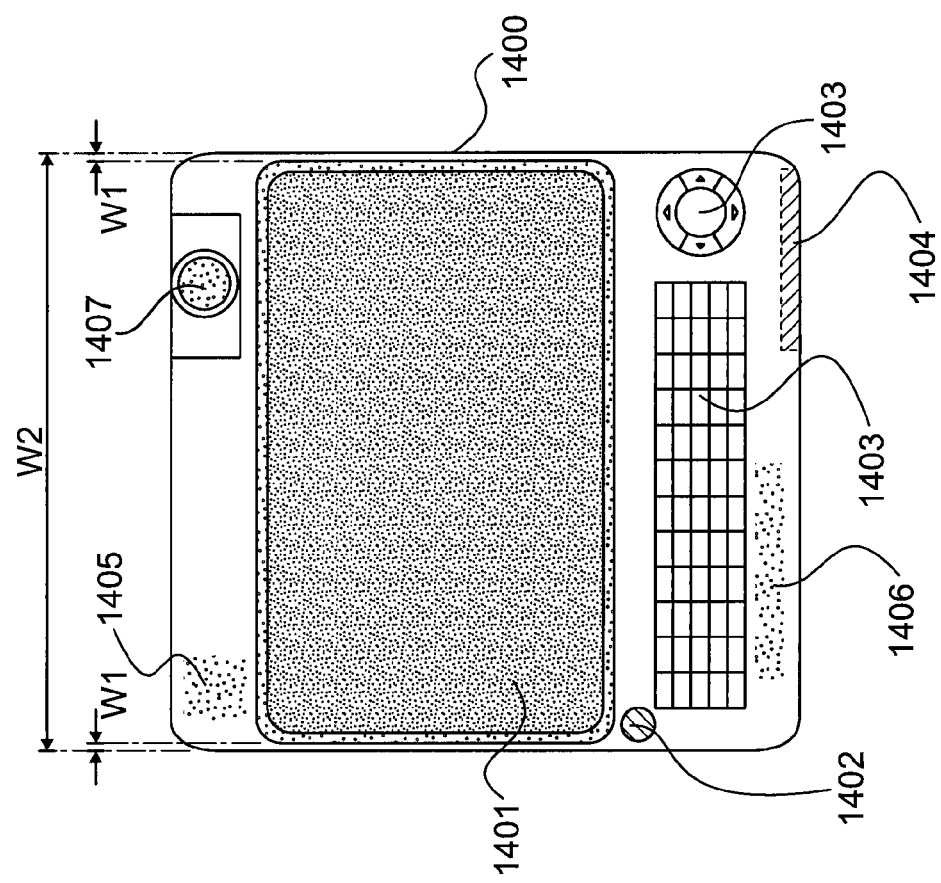

An example of the electronic apparatuses using the display device of the present invention is shown in FIGS. 14A and 14B.

FIG. 14A shows a portable information terminal which is comprised of a main body 1400, a display portion 1401, a power supply switch 1402, an operation key 1403, an exterior connection port 1404, an audio output portion 1405, an audio input portion 1406, a camera portion 1407, and the like. The display device of the present invention can be used to the display portion 1401. As a result, as shown in FIG. 14A, the width W1 of the frame around the display screen that has the display portion 1401 can be lessened, therefore, the width W2 of the main body of the portable information terminal device can be lessened.

Thus, a portable information device convenient to carry is provided.

FIG. 14B shows a cellular phone which is comprised of a main body 1410, a display portion 1411, a power supply switch 1412, an operation key 1413, an exterior input port 1414, an audio output portion 1415, an audio input 1416, an antenna 1417, and the like. The display device of the present invention can be used to the display portion 1411. As a result, as shown in FIG. 14B, the width W3 of the frame around the display screen that has the display portion can be lessened, therefore, the width W4 of the main body of the cellular phone can be lessened.

Thus, the cellular phone convenient to carry is provided.

The display device is not limited to the above examples, it also can be used to various electronic apparatuses.

This embodiment may be combined freely with Embodiments 1 through 4.

According to the present invention, a gate signal line driving circuit is arranged in parallel to a source signal line driving circuit in a display device with the driving circuits (source signal line driving circuit and gate signal line driving circuit) for inputting signals to a plurality of pixels being formed on the same insulating surface where the plural pixels are formed as in the above-described structures. The frame area in the lateral direction of the display device can be thus reduced.

What is claimed is:
1. A display device comprising:
a pixel portion over a first substrate, comprising:
a plurality of pixels each comprising a thin film transistor;
a wiring region over the first substrate, comprising a plurality of gate signal lines;
a driver circuit over the first substrate, comprising:
a gate driver circuit electrically connected to the plurality of gate signal lines; and
a source driver circuit electrically connected to a plurality of source signal lines; and
a sealing member bonding the first substrate and a second substrate,
wherein the thin film transistor of each of the plurality of pixels is electrically connected to a corresponding one of the plurality of gate signal lines, and to a corresponding one of the plurality of source signal lines,
wherein the wiring region includes none of the pixels,
wherein the pixel portion is substantially rectangular with a first side, a second side, a third side and a fourth side, the fourth side being opposing to the first side,
wherein no transistor is provided in an outer portion of the second side and in an outer portion of the third side,
wherein the driver circuit is provided only in an outer portion of the first side, and
wherein the wiring region is provided in one of the outer portion of the second side and the outer portion of the third side.
2. The display device according to claim 1, wherein the display device is a liquid crystal display device.
3. The display device according to claim 1, wherein the display device comprises an organic light emitting layer.
4. The display device according to claim 1, wherein the display device is used to a portable information terminal.
5. The display device according to claim 1, wherein the display device is used to a cellular phone.
6. The display device according to claim 1, wherein the gate driver circuit and the source driver circuit comprises a thin film transistor.
7. The display device according to claim 1, wherein the display device further comprises a second driver circuit comprising one of a gate driver circuit and a source driver circuit in an outer portion of the fourth side.
8. The display device according to claim 1,
wherein each of the plurality of pixels further comprises a capacitor storage, and
wherein one of a source region and a drain region of the thin film transistor is connected to one of the plurality of the source signal lines and the other is connected to the capacitor storage.
9. The display device according to claim 1,
wherein the source driver circuit in the driver circuit is formed between the pixel portion and the gate driver circuit, and
wherein none of the plurality of gate signal lines overlaps with the source driver circuit in the driver circuit.
10. The display device according to claim 1, wherein the sealing member is provided outside of the driver circuit and the pixel portion.
11. The display device according to claim 1,
wherein the sealing member is provided at least one of the plurality of gate signal lines with an interlayer film therebetween,
wherein none of the plurality of gate signal lines are located outside of the sealing member, in outer regions of the second side and the third side.
12. A display device comprising:
a pixel portion over a first substrate, comprising:
a plurality of pixels each comprising a thin film transistor;
a first wiring region and a second wiring region over the first substrate, each of the first wiring region and the second wiring region comprising a plurality of gate signal lines;
a driver circuit over the first substrate, comprising:
a gate driver circuit electrically connected to the plurality of gate signal lines; and
a source driver circuit electrically connected to a plurality of source signal lines; and
a sealing member bonding the first substrate and a second substrate,
wherein each of the plurality of pixels is electrically connected to a corresponding one of the plurality of gate signal lines, and to a corresponding one of the plurality of source signal lines,
wherein the first wiring region and the second wiring region include none of the pixels,
wherein the pixel portion is substantially rectangular with a first side, a second side, a third side and a fourth side, the fourth side being opposing to the first side,
wherein the plurality of pixels comprises a first pixel that is driven by an n-th gate signal line, a second pixel that is driven by an (n+1)-th gate signal line and a third pixel that is driven by an (n+2)-th gate signal line (n is an integer),
wherein, among the first pixel, the second pixel and the third pixel, the first pixel is the nearest to the first side and the third pixel is the nearest to the fourth side,
wherein the n-th gate signal line and the (n+2)-th gate signal line are included in the first wiring region and not included in the second wiring region when the (n+1)-th gate signal line is included in the second wiring region and not included in the first wiring region, wherein the first wiring region is provided in an outer portion of the second side,
wherein the second wiring region is provided in an outer portion of the third side,
wherein the driver circuit is provided only in an outer portion of the first side,
wherein no transistor is provided in the outer portion of the second side and in the outer portion of the third side, and
wherein output signals of the gate driver circuit are input to the plurality of gate signal lines of the first wiring region and the second wiring region.

13. The display device according to claim 12, wherein the display device is a liquid crystal display device.

14. The display device according to claim 12, wherein the display device comprises an organic light emitting layer.

15. The display device according to claim 12, wherein the display device is used to a portable information terminal.

16. The display device according to claim 12, wherein the display device is used to a cellular phone.

17. The display device according to claim 12, wherein the gate driver circuit and the source driver circuit comprises a thin film transistor.

18. The display device according to claim 12, wherein the display device further comprises a second driver circuit comprising one of a gate driver circuit and a source driver circuit in an outer portion of the fourth side.

19. The display device according to claim 12,
wherein each of the plurality of pixels further comprises a capacitor storage, and
wherein one of a source region and a drain region of the thin film transistor is connected to one of the plurality of the source signal lines and the other is connected to the capacitor storage.

20. The display device according to claim 12,
wherein the source driver circuit in the driver circuit is formed between the pixel portion and the gate driver circuit, and
wherein none of the plurality of gate signal lines overlaps with the source driver circuit in the driver circuit.

21. The display device according to claim 12, wherein the sealing member is provided outside of the driver circuit and the pixel portion.

22. The display device according to claim 12,
wherein the sealing member is provided at least one of the plurality of gate signal lines with an interlayer film therebetween,
wherein none of the plurality of gate signal lines are located outside of the sealing member, in outer regions of the second side and the third side.

* * * * *